United States Patent
Gomes et al.

(10) Patent No.: US 7,171,602 B2
(45) Date of Patent: *Jan. 30, 2007

(54) EVENT PROCESSING APPARATUS AND METHOD FOR HIGH SPEED EVENT BASED TEST SYSTEM

(75) Inventors: Glen Gomes, Santa Clara, CA (US); Anthony Le, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 387 days.

This patent is subject to a terminal disclaimer.

(21) Appl. No.: 10/318,959

(22) Filed: Dec. 13, 2002

(65) Prior Publication Data

US 2003/0229473 A1 Dec. 11, 2003

Related U.S. Application Data

(60) Provisional application No. 60/346,091, filed on Dec. 31, 2001.

(51) Int. Cl.
G01R 31/28 (2006.01)
G06F 11/00 (2006.01)

(52) U.S. Cl. ............... 714/744; 714/742; 714/738

(58) Field of Classification Search ............... 714/738, 714/731, 739, 758, 728, 744, 742
See application file for complete search history.

(56) References Cited

U.S. PATENT DOCUMENTS

| | | | |
|---|---|---|---|
| 5,212,443 A | | 5/1993 | West et al. |
| 5,225,772 A | * | 7/1993 | Cheung et al. ............ 324/73.1 |
| 5,477,139 A | * | 12/1995 | West et al. ............... 324/158.1 |
| 5,592,659 A | | 1/1997 | Toyama et al. |
| 6,032,277 A | * | 2/2000 | Okumura ..................... 714/724 |
| 6,226,765 B1 | * | 5/2001 | Le et al. ...................... 714/718 |
| 6,532,561 B1 | * | 3/2003 | Turnquist et al. ........... 714/738 |
| 6,557,133 B1 | * | 4/2003 | Gomes ........................ 714/738 |
| 6,678,645 B1 | * | 1/2004 | Rajsuman et al. ............ 703/20 |

* cited by examiner

*Primary Examiner*—Albert Decady
*Assistant Examiner*—Mujtaba K. Chaudry
(74) *Attorney, Agent, or Firm*—Muramatsu & Associates

(57) ABSTRACT

An apparatus and method for computing event timing for high speed event based test system. The event processing apparatus includes an event memory for storing event data of each event where the event data includes timing data for each event which is formed with an integer multiple of a clock period and a fraction of the clock period, an event summing logic for accumulating the timing data and producing the accumulated timing data in a parallel form, and an event generator for generating events specified by the event data based on the accumulated timing data received in the parallel form from the event summing logic. The events in the event data are specified as groups of events where each group of event is configured by one base event and at least one companion event.

29 Claims, 22 Drawing Sheets

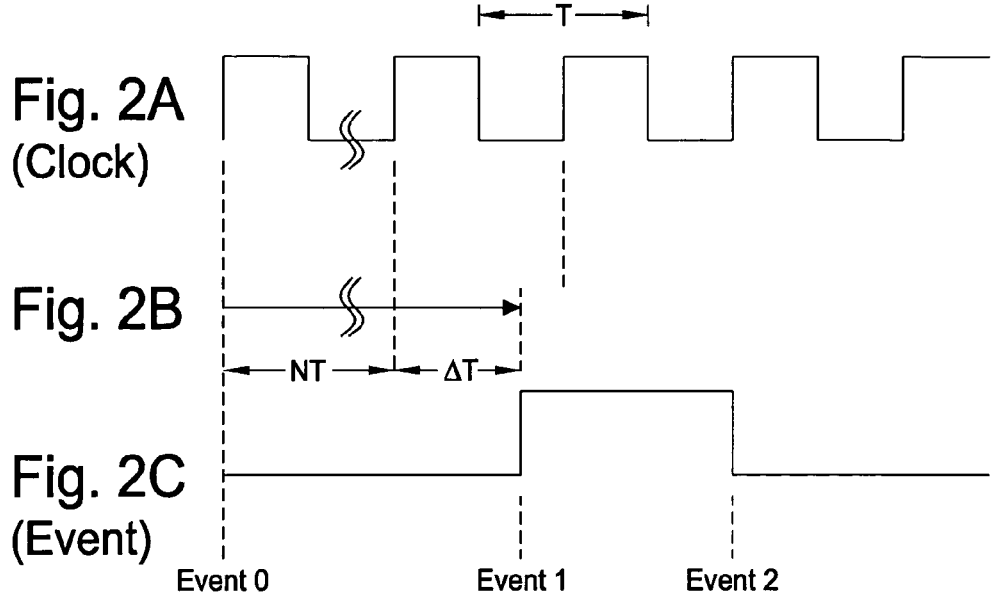

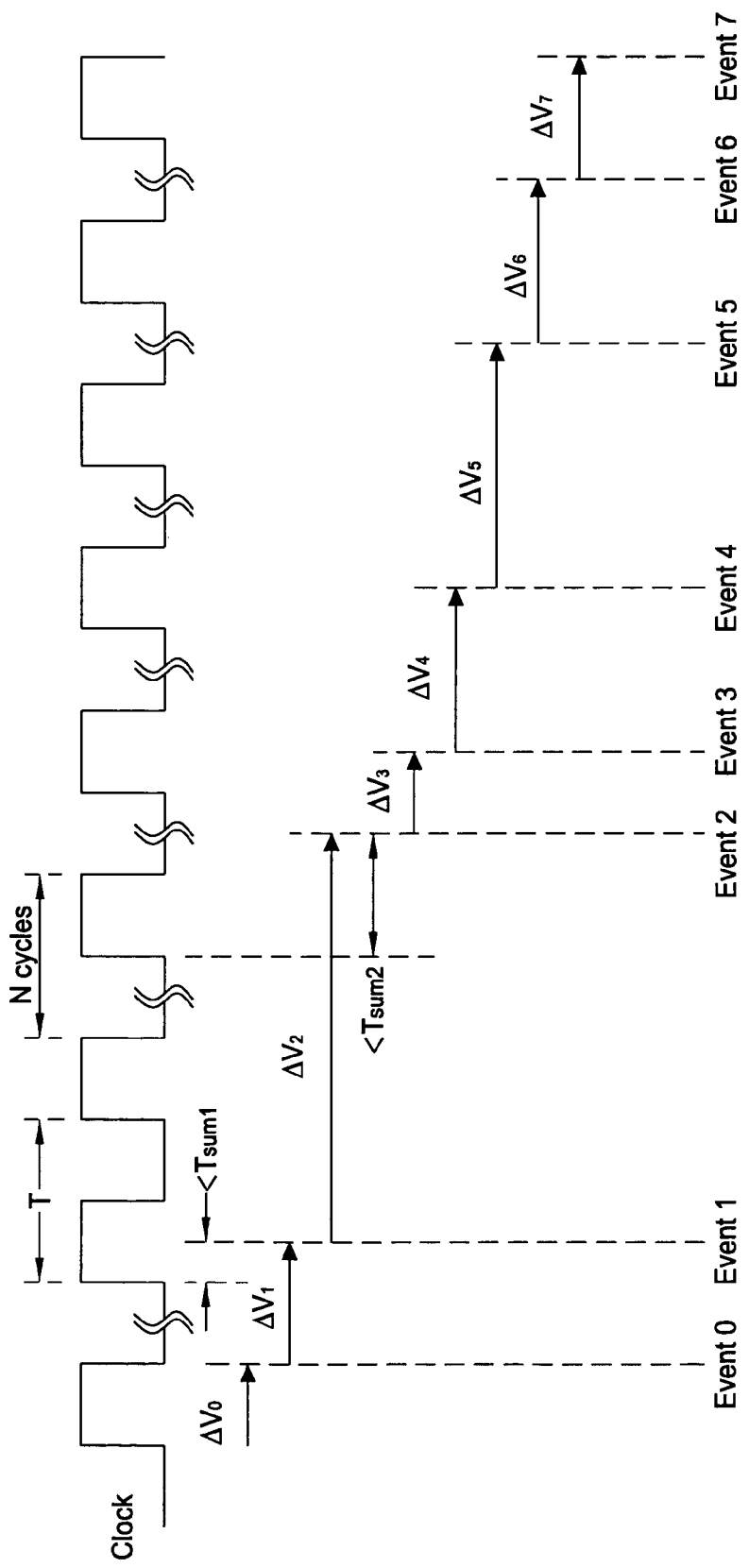

Fig.4A

|    | Event | Count | Vernier | Event Type |
|----|-------|-------|---------|------------|
| E0 | $\Delta V_0$ | C0 | V0 | Drive Logical Low |
| E1 | $\Delta V_1$ | C1 | V1 | Drive Logical High |
| E2 | $\Delta V_2$ | C2 | V2 | Drive Logical Low |
| E3 | $\Delta V_3$ | C3 | V3 | Drive Logical High |
| E4 | $\Delta V_4$ | C4 | V4 | Drive Logical Low |
| E5 | $\Delta V_5$ | C5 | V5 | Drive Logical High |
| E6 | $\Delta V_6$ | C6 | V6 | Drive Logical Low |
| E7 | $\Delta V_7$ | C7 | V7 | Drive Logical High |
| E8 | $\Delta V_8$ | C8 | V8 | Drive Logical Low |

|    | Event | Count | Vernier | Event Type | Event Description |
|----|-------|-------|---------|------------|-------------------|
| E0 | $\Delta V_0$ | C0 | V0 | Drive Low | Base |
| E1 | $\Delta V_1$ | <None> | V1 | Drive High | Companion |
| E2 | $\Delta V_2$ | C2 | V2 | Drive Low | Base |
| E3 | $\Delta V_3$ | <None> | V3 | Drive High | Companion |
| E4 | $\Delta V_4$ | C4 | V4 | Drive Low | Base |
| E5 | $\Delta V_5$ | <None> | V5 | Drive High | Companion |

Fig. 9

|    | Event | Count | Vernier | Event Type | Event Description |
|----|-------|-------|---------|------------|-------------------|
| E0 | $\Delta V_0$ | C0 | V0 | Drive Low | Base |
| E1 | $\Delta V_1$ | <None> | V1 | Drive High | Companion |
| E2 | $\Delta V_2$ | <None> | V2 | Drive Low | Companion |
| E3 | $\Delta V_3$ | <None> | V3 | Drive High | Companion |
| E4 | $\Delta V_4$ | C4 | V4 | Drive Low | Base |
| E5 | $\Delta V_5$ | <None> | V5 | Drive High | Companion |
| E6 | $\Delta V_6$ | <None> | V6 | Drive Low | Companion |
| E7 | $\Delta V_7$ | <None> | V7 | Drive High | Companion |

Fig. 12

|    | Event | Count | Vernier | Event Type | Event Description |
|----|-------|-------|---------|------------|-------------------|
| E0 | $\Delta V_0$ | C0 | V0 | Drive Low | Base |
| E1 | $\Delta V_1$ | <None> | V1 | Drive High | Companion |
| E2 | $\Delta V_2$ | C2 | V2 | Drive Low | Base |
| E3 | $\Delta V_3$ | <None> | V3 | Drive High | Companion |
| E4 | $\Delta V_4$ | C4 | V4 | Drive Low | Base |
| E5 | $\Delta V_5$ | <None> | V5 | Drive High | Companion |

Fig. 14

|  | Event | Count | Vernier | Event Type | Event Description |
|---|---|---|---|---|---|
| E0 | $\Delta V_0$ | C0 | V0 | Drive Low | Base |
| E1 | $\Delta V_1$ | <None> | V1 | Drive High | Companion |
| E2 | $\Delta V_2$ | <None> | V2 | Drive Low | Companion |
| E3 | $\Delta V_3$ | <None> | V3 | Drive High | Companion |
| E4 | $\Delta V_4$ | C4 | V4 | Drive Low | Base |
| E5 | $\Delta V_5$ | <None> | V5 | Drive High | Companion |
| E6 | $\Delta V_6$ | <None> | V6 | Drive Low | Companion |
| E7 | $\Delta V_7$ | <None> | V7 | Drive High | Companion |

| Processing Clock Frequency | Event Clock Frequency | Vernier per Clock | # Vernier Bits | Resolution (pS) |
|---|---|---|---|---|
| 125MHz | 125MHz | 1 | 7 | 62.50 |
| 250MHz | 250MHz | 1 | 7 | 31.25 |
| 250MHz | 500MHz | 2 | 7 | 31.25 |
| 250MHz | 1GHz | 4 | 7 | 31.25 |
| 250MHz | 1.5GHz | 6 | 7 | 31.25 |

| Processing Clock Frequency | Event Clock Frequency | Vernier per Clock | # Vernier Bits | Resolution (pS) |
|---|---|---|---|---|
| 125MHz | 125MHz | 1 | 7 | 62.50 |
| 250MHz | 250MHz | 1 | 7 | 31.25 |
| 250MHz | 500MHz | 2 | 8 | 15.63 |
| 250MHz | 1GHz | 4 | 9 | 7.81 |
| 250MHz | 1.5GHz | 6 | 10 | 3.91 |

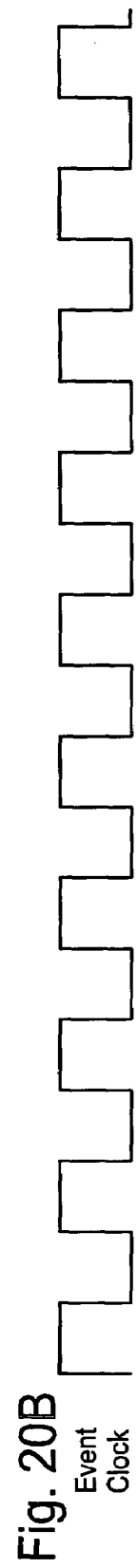
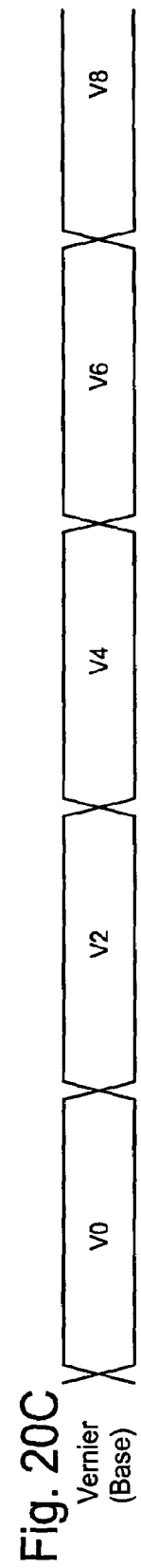
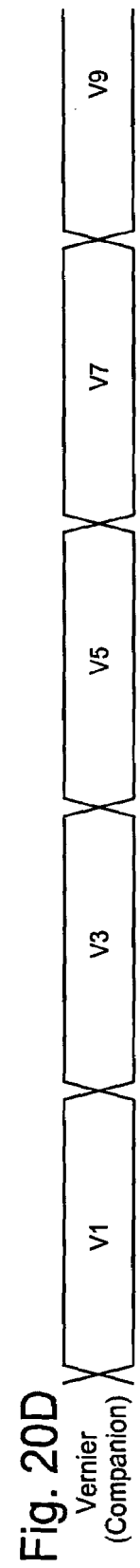
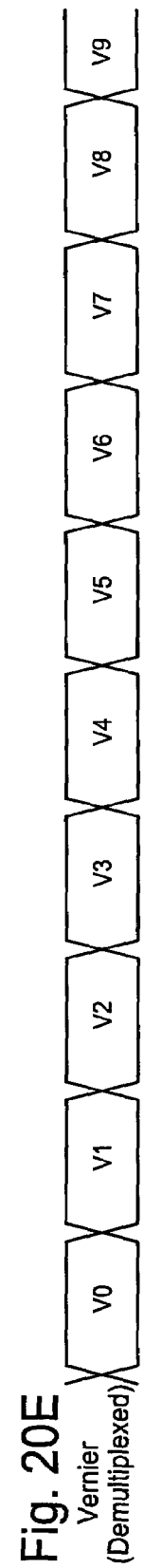
Fig. 20A Processing Clock
Fig. 20B Event Clock
Fig. 20C Vernier (Base)
Fig. 20D Vernier (Companion)
Fig. 20E Vernier (Demultiplexed)

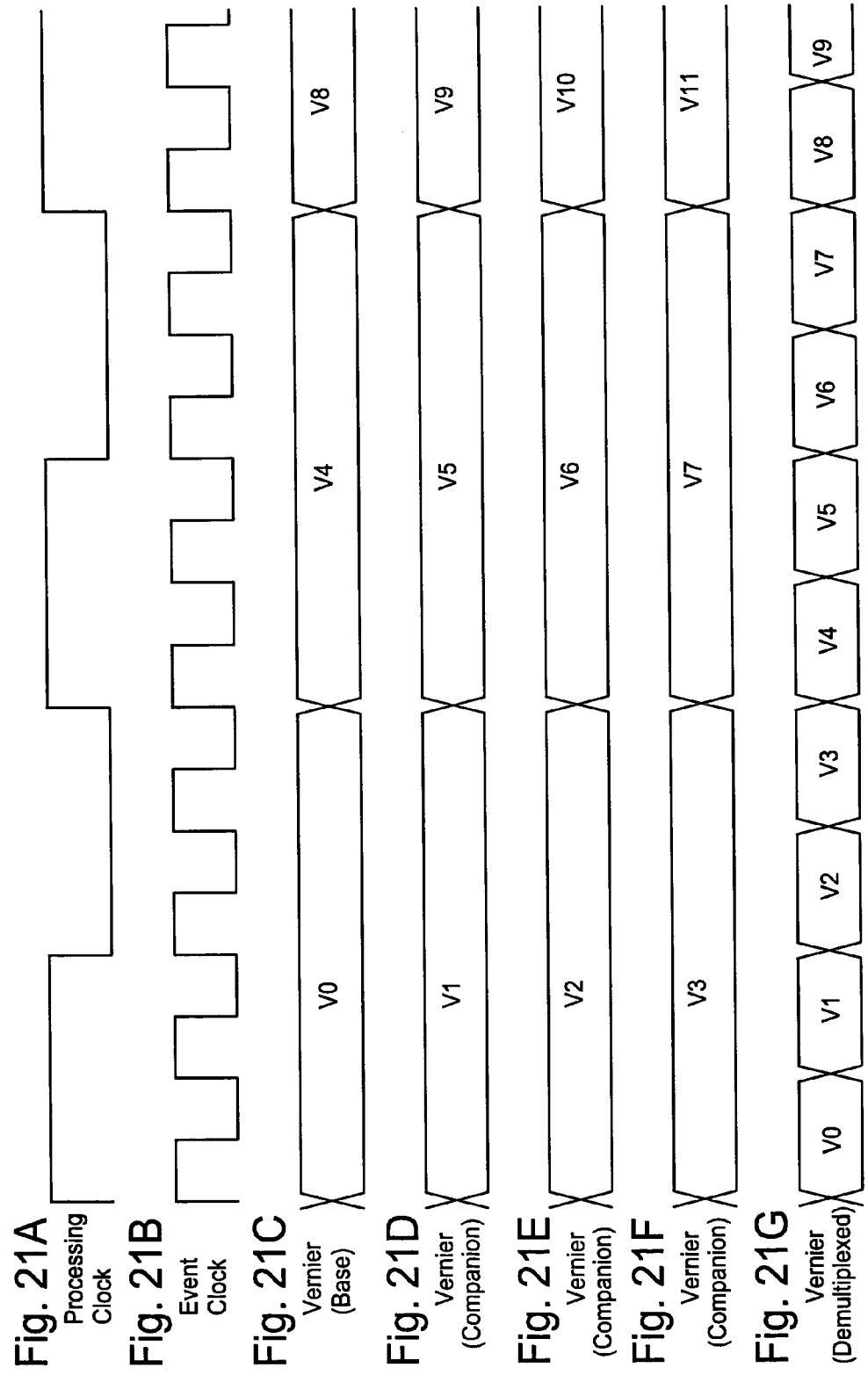

Fig. 22

| Processing Clock Frequency | Event Clock Frequency | Vernier per Clock | # Vernier Bits | Resolution (pS) |
|---|---|---|---|---|
| 125MHz | 125MHz | 1 | 7 | 62.50 |
| 250MHz | 250MHz | 1 | 7 | 31.25 |
| 250MHz | 500MHz | 2 | 7 | 15.63 |
| 250MHz | 1GHz | 4 | 7 | 7.81 |
| 250MHz | 1.5GHz | 6 | 7 | 5.21 |

Fig. 23

| | Event | Count | Vernier | Event Type | Event Description |
|---|---|---|---|---|---|
| E0 | $\Delta V_0$ | C0 | V0 | Drive High | Base |
| E1 | $\Delta V_1$ | <None> | V1 | Drive Low | Companion |
| E2 | $\Delta V_2$ | C2 | V2 | NOP | Base |
| E3 | $\Delta V_3$ | <None> | V3 | NOP | Companion |
| E4 | $\Delta V_4$ | C4 | V4 | Drive High | Base |
| E5 | $\Delta V_5$ | <None> | V5 | NOP | Companion |
| E6 | $\Delta V_6$ | C6 | V6 | Drive Low | Base |
| E7 | $\Delta V_7$ | <None> | V7 | NOP | Companion |
| E8 | $\Delta V_8$ | C8 | V8 | NOP | Base |
| E9 | $\Delta V_9$ | <None> | V9 | Drive High | Companion |

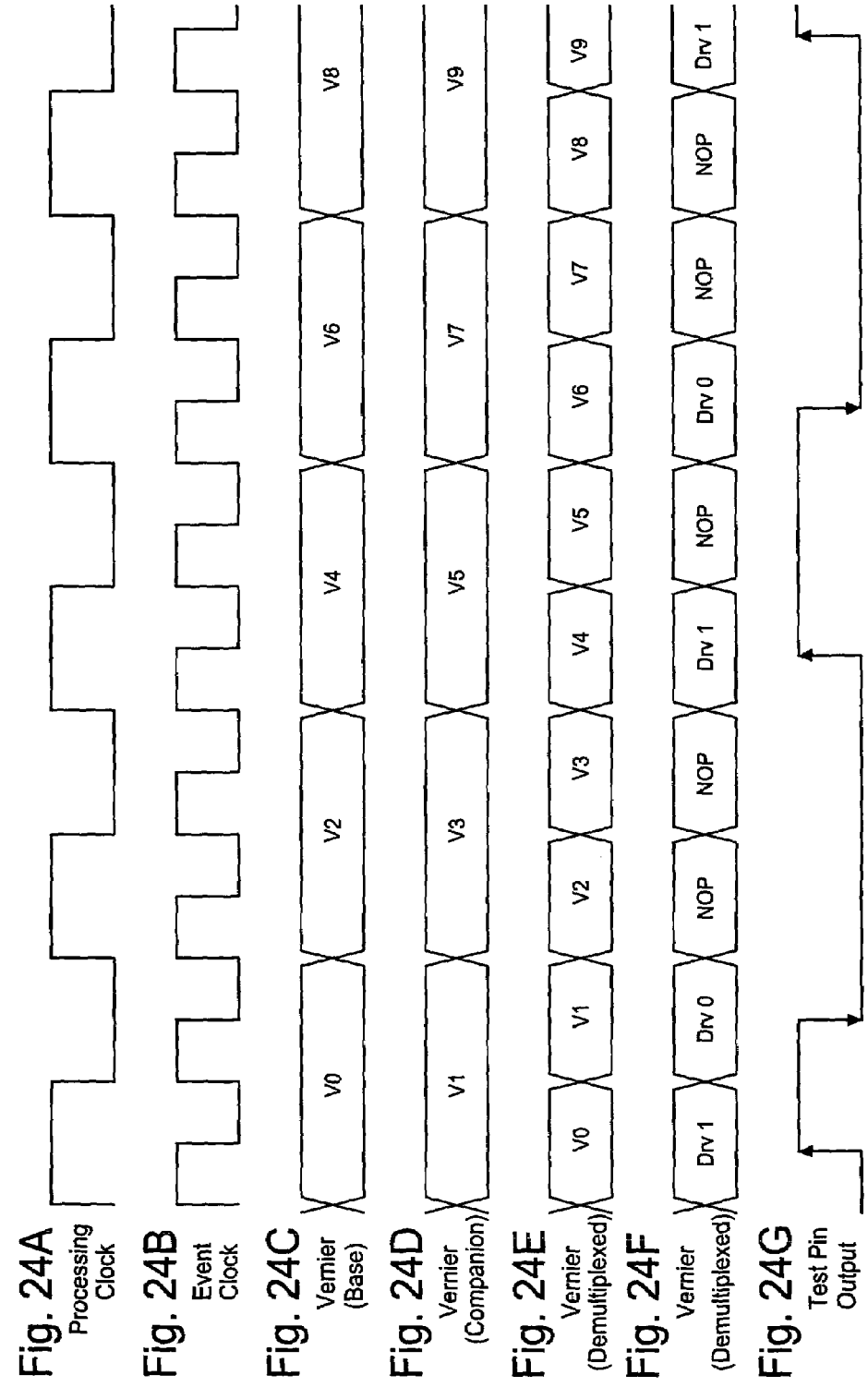

EVENT PROCESSING APPARATUS AND METHOD FOR HIGH SPEED EVENT BASED TEST SYSTEM

This application claims the benefit of U.S. Provisional Application No. 60/346,091 filed Dec. 31, 2001.

FIELD OF THE INVENTION

This invention relates to a semiconductor test system for testing semiconductor devices, and more particularly, to an apparatus and method for computing event timing for generating test patterns for high speed event based test system to evaluate a semiconductor device under test wherein the timing of each event is defined either by a time length from a predefined base event or from the time length of a companion event.

BACKGROUND OF THE INVENTION

In testing semiconductor devices such as ICs and LSIs by a semiconductor test system, such as an IC tester, a semiconductor IC device to be tested is provided with test signals produced by an IC tester at its appropriate pins at predetermined test timings. The IC tester receives output signals from the IC device under test generated in response to the test signals. The output signals are strobed, i.e., sampled by strobe signals with predetermined timings to be compared with expected data to determine whether the IC device functions correctly.

The assignee of this invention has developed an event based test system wherein the desired test signals and strobe signals are produced by data from an event memory directly on a per pin basis. In an event based test system, test data is described in terms of event and its timing where events are any changes of the logic state in the signals used for testing a semiconductor device under test. For example, such changes are rising and falling of test signals (drive events) and strobe signals (strobe events or sampling events). Typically, a timing of each event is defined either as a time length from the most recent event (immediately prior to the current event) or in absolute time (from time zero) The present invention is directed to such an event based test system. With reference to FIGS. 1–3, the event based test system developed by the assignee of the invention is briefly described here. An example of basic structure in the event based test system is shown in a block diagram of FIG. 1.

In FIG. 1, the event based test system includes a host computer 12 and a bus interface 13 both are connected to a system bus 14, an internal bus 15, an address control logic 18, a failure memory 17, an event memory 30 consisting of an event count memory 20 and an event vernier memory 21, an event summing and scaling logic 22, an event generator 24, and a pin electronics 26. The event based test system evaluates a semiconductor device under test (DUT) 28 connected to the pin electronics 26.

An example of the host computer 12 is a work station having a UNIX operating system therein. The host computer 12 functions as a user interface to enable a user to instruct the start and stop operation of the test, to load a test program and other test conditions, or to perform test result analysis in the host computer. The host computer 12 interfaces with a hardware test system through the system bus 14 and the bus interface 13.

The internal bus 15 is a bus in the hardware test system and is commonly connected to most of the functional blocks such as the address control logic 18, failure memory 17, event summing and scaling logic 22, and event generator 24. An example of the address control logic 18 is a tester processor which is exclusive to the hardware test system and is not accessible by a user. The tester processor (address control logic) 18 provides instructions to other functional blocks in the test system based on the test program and conditions from the host computer 12. The failure memory 17 stores test results, such as failure information of the DUT 28, in the addresses defined by the address control logic 18. The information stored in the failure memory 17 is used in the failure analysis stage of the device under test.

The address control logic 18 provides address data to the event count memory 20 and the event vernier memory 21 as shown in FIG. 1. In an actual test system, a plurality of sets of event count memory and event vernier memory will be provided, each set of which may correspond to a test pin of the test system. The event count and vernier memories store the timing data for each event of the test signals and strobe signals. The event count memory 20 stores the timing data which is an integer multiple of the reference clock (event count data), and the event vernier memory 21 stores timing data which is a fraction of the reference clock (event vernier data).

The event summing and scaling logic 22 is to produce data showing overall timing of each event based on the timing data from the event count memory 20 and the event vernier memory 21. Basically, such overall timing data is produced by summing the event count data (integer multiple data) and the event vernier data (the fractional data). During the process of summing the timing data, a carry over operation of the fractional data (offset to the integer data) is also conducted in the timing count and offset logic 22. Further during the process of producing the overall timing, timing data may be modified by a scaling factor so that the overall timing can be modified accordingly.

The event generator 24 is to actually generate the events based on the overall timing data from the event summing and scaling logic 22. The events (drive events and/or sampling signals) thus generated are provided to the DUT 28 through the pin electronics 26. Basically, the pin electronics 26 is formed of a large number of components, each of which includes a driver and a comparator as well as switches to establish input and output relationships with respect to the DUT 28.

For producing high resolution timings, as noted above, the time length (delay value) between the events is defined by a combination of an integer multiple of a reference clock cycle (event count data) and a fraction of the reference clock cycle (event vernier data). A timing relationship between the event count and the event vernier is shown in a timing chart of FIG. 2. In this example, a reference clock (event clock) of FIG. 2A has a clock cycle (time period) T. Event 0, Event 1 and Event 2 of FIG. 2C are related as to the timing in a manner shown in FIG. 2C. To describe Event 1 with reference to Event 0, the timing relationship of FIG. 2B is used in which NT denotes the event count which is N times of the reference clock period T and ΔT denotes the event vernier which is a fraction of the reference clock period T.

Each of these events may consist of a drive event or a sampling event. Drive events are those events where the signal on a tester pin is driven to a specific voltage level. In general, there are drive events specified to drive a pin of a device under test (DUT) to a logical high voltage level, a logical low voltage level, or to a high-impedance voltage level (drive Z). Sampling events are defined to be able to sample the output of the DUT pin at a logical high voltage level, a logical low voltage level, or an intermediate voltage level.

As noted above, in an event based test system, the event data in the event memory is expressed by a time difference between the current event and the previous event. Thus, to produce events according to the event data, an event based test system must be able to calculate the sum of the delays up to each event. This requires a logic in the test system to keep counting of the delay times expressed in the event count and to sum the event vernier values.

Such a relationship is shown in a timing chart of FIG. 3 in which Events 0–7 are expressed with reference to the reference clock having a time period T=1. For example, a time difference $\Delta V_0$ for Event 0 from a start point may be 0.75 (event count "0", and event vernier "0.75"), and a time difference $\Delta V_1$ for Event 1 from Event 0 may be 1.50 (event count "1", and event vernier "0.50"). In this situation, the total delay of Event 1 will be 2.25 where a logic in the test system counts two event clocks "2.0" and calculates the sum of event vernier "0.25" as the remaining fractional delay. This summing operation is essential for calculating the correct vernier during each event involved in a test signal.

In the U.S. Pat. No. 6,360,343, U.S. application Ser. No. 09/286,226 (now U.S. Pat. No. 6,557,133), and U.S. application Ser. No. 09/535,031 (now U.S. Pat. No. 6,668,331) owned by the same assignee of this invention, it is disclosed an event summing and scaling logic for calculating a timing of the current event using the event data from the event memory. These patents are incorporated by reference. The method described in the patents assumed direct match of both an event clock and a processing clock, i.e, the event count logic can simply count processing clocks and the vernier accumulation represents fractions of a processing clock cycle. Namely, the prior method does not take the difference between the event clock and the processing clock into account.

Within the context of the present invention, an event clock is a processing rate of the event data and a processing clock is a clock that the hardware uses to conduct its event processing. Typically, an event clock is the highest speed clock in the test system while a processing clock is a lower speed clock produced by dividing the frequency of the event clock to meet the operation speed of the hardware. Thus, in a high speed test system where hardware is able to operate in a high speed, the processing clock can be the same as the event clock. However, in a practical use, for a lower speed test system, an event clock is much faster than a processing clock and consequently, the method disclosed in the prior application cannot work effectively.

Therefore, what is needed is an event processing apparatus and method for a high speed event based test system which is able to perform high speed event timing processing even when a processing clock is much slower than an event clock.

SUMMARY OF THE INVENTION

It is, therefore, an object of the present invention to provide a high speed event based semiconductor test system for producing test vectors at high speed with use of hardware of a relatively slow operating speed based on event data stored in an event memory.

It is another object of the present invention to provide an event processing apparatus and method for a high speed event based test system with use of a processing clock which is much slower than an event clock.

It is a further object of the present invention to provide an event processing apparatus and method for a high speed event based test system by performing a parallel event processing with use of the processing clock, thereby producing accumulated vernier data at the rate of the event clock.

It is a further object of the present invention to provide an event based test system for producing events of high timing resolution corresponding to the event clock with use of the processing clock which is much slower than the event clock.

It is a further object of the present invention to provide an event based test system for producing events of high timing resolution by converting a plurality of vernier data values received in a parallel form at the rate of processing clock and producing the vernier data values in a serial form at the rate of the event clock.

The present invention is an event processing apparatus and method for use with an event based test system for testing a semiconductor device under test (DUT) by producing events of various timings for supplying drive events to the DUT and evaluating outputs of the DUT at timings of sampling events. The event processing apparatus includes an event memory for storing event data of each event where the event data includes timing data for each event which is formed with an integer multiple of a clock period and a fraction of the clock period, an event summing logic for accumulating the timing data and producing the accumulated timing data in a parallel form, and an event generator for generating events specified by the event data based on the accumulated timing data received in the parallel form from the event summing logic. The events in the event data are specified as groups of events where each group is configured by one base event and at least one companion event.

The event data stored in the event memory includes event type data for each event to specify a type of event to be produced by the event generator. The timing data for the base event is formed of a set of the event count data and the event vernier data while the timing data for the companion event is formed solely of the event vernier data.

In one aspect, the accumulated timing data for the base event is a sum of the timing data of prior base events and a current base event, and the accumulated timing data for the companion event is a sum of the accumulated timing data for the base event and the vernier data of the companion event defined with reference to the base event. In another aspect, the accumulated timing data is a sum of the timing data of prior base and companion events and a current event which is produced by serial processing by the event summing logic. The accumulated timing data for each group of the base event and the companion event is produced in the parallel form by the event summing logic.

The clock period is a one cycle time length of a processing clock which is a reference clock for operating hardware of the event processing apparatus. The event summing logic produces the accumulated timing data at a plurality of outputs in the parallel form thereby enabling to produce the events at a rate of an event clock which has a frequency higher than the processing clock. The number of the parallel outputs of the event summing logic corresponds to a ratio of the frequencies between the processing clock and the event clock. Further, the number of the parallel outputs corresponds to a total number of the base event and the companion events in each group of the event data stored in the event memory.

In a further aspect, the event processing apparatus includes an event memory for storing event data of each event where the event data includes timing data for each event which is formed with an integer multiple of a clock period (event count data) and a fraction of the clock period (event vernier data), wherein the event data are specified as groups of events where each group is configured by one base event and at least one companion event, an event summing logic for accumulating the timing data and producing the accumulated timing data at N outputs in a parallel form wherein the event summing logic is operated by a processing clock, and an event generator for generating events specified by the event data based on N accumulated timing data received in the parallel form from the event summing logic. The event generator receives N accumulated timing data in the parallel form from the event summing logic at a rate of the processing clock and produces the accumulated timing data in a serial form at a rate of an event clock which is N times higher than that of the processing clock.

A further aspect of the present invention is an event processing method for use with an event based test system. The method includes the steps of: storing event data which includes timing data for each event and is formed with an integer multiple of a clock period (event count data) and a fraction of the clock period (event vernier data) where the event data are specified as groups of events where each group is configured by one base event and at least one companion event, accumulating the timing data and producing the accumulated timing data for the base event and the companion event in a parallel form, and generating the events specified by the event data based on the accumulated timing data received in the parallel form.

A further aspect of the present invention is an event processing method for use with an event based test system. The method includes the steps of: storing event data which includes timing data for each event and is formed with an integer multiple of a clock period (event count data) and a fraction of the clock period (event vernier data), wherein the event data are specified as groups of events where each group is configured by one base event and at least one companion event, accumulating the timing data and producing the accumulated timing data at N outputs in a parallel form at a rate of a processing clock, and receiving N accumulated timing data in the parallel form at the rate of the processing clock and producing the accumulated timing data in a serial form at a rate of an event clock which is N times higher than that of the processing clock.

According to the present invention, the event timing processing for a high speed event based semiconductor test system can be performed to produce the vernier data at the rate of an event clock with use of a processing clock which is much slower than the event clock. The event processing apparatus performs a parallel event processing with use of the processing clock thereby producing accumulated vernier data at the rate of the event clock.

Further, in the present invention, the event based test system is able to produce delay times of high timing resolution corresponding to the event clock with use of the processing clock. The event generator in the event based test system receives a plurality of vernier data values received in a parallel form at the rate of processing clock and producing the vernier data values in a serial form at the rate of the event clock thereby achieving the timing resolution matches with the event clock.

BRIEF DESCRIPTION OF THE DRAWINGS

FIG. 2 is a timing diagram showing a basic timing relationship between the event count data and the event vernier data for describing a time difference between two adjacent events.

FIG. 3 is a timing chart showing timing relationships among various events relative to an event clock for showing the concept of an event summing operation in the event based test system.

FIG. 4A is a table showing a general example of event data stored in an event memory when an event clock and a processing clock are in a 1-to-1 relationship.

FIG. 9 is a data table showing an example of event data stored in the event memory for performing the 1-to-4 parallel event processing to produce the timing relationship shown in FIG. 8.

FIG. 12 is a data table showing an example of event data stored in the event memory for performing the 1-to-2 serial event processing to produce the timing relationship shown in 11.

FIG. 14 is a data table showing an example of event data stored in the event memory for performing the 1-to-4 serial event processing to produce the timing relationship shown in FIG. 13.

FIGS. 20A–20E are timing charts showing the timing relationship in the vernier data in the event generator of FIG. 19 when the event generator is incorporating 1-to-2 event demultiplexing.

FIGS. 21A–21G are timing charts showing the timing relationship in the vernier data in the event generator of FIG. 19 when the event generator is incorporating 1-to-4 event demultiplexing.

FIG. 22 is a table showing the timing resolution of the vernier data with fixed vernier bits when the vernier bits are a fraction of the event clock in the third embodiment of the present invention when the event generator is configured as shown in FIG. 19.

FIG. 23 is a table showing an example of event data stored in the event memory including non-operation (NOP) events as the event type data for producing the waveforms of FIGS. 24A–24G.

FIGS. 24A–24G are timing charts showing the timing relationship produced by the event generator of FIG. 19 incorporating the 1-to-2 event demultiplexing based on the event data of FIG. 23.

DETAILED DESCRIPTION OF THE INVENTION

Embodiments of the present invention will be described with reference to the accompanying drawings. An event processing method and apparatus is able to perform event timing processing for a high speed test system with use of a processing clock which is much slower than an event clock. As noted above, in the present invention, an event clock is a processing rate of the event data, and a processing clock is a clock that the hardware uses to conduct its event processing. Because of the parallel processing, the present invention achieves a high event processing rate by using multiple verniers per processing clock cycle, thereby creating a high speed test system.

First, the process of event timing computation is considered where the event clock and the processing clock are identical to one another. This case arises when an event test system is a high speed system in which hardware is able to operate by a processing clock that has the same repetition rate as that of an event clock. The direct match of both the event clock and processing clock means that the event count logic can simply count the processing clocks, and the vernier accumulation represents fractions of the processing clock cycle.

Figure 4B:
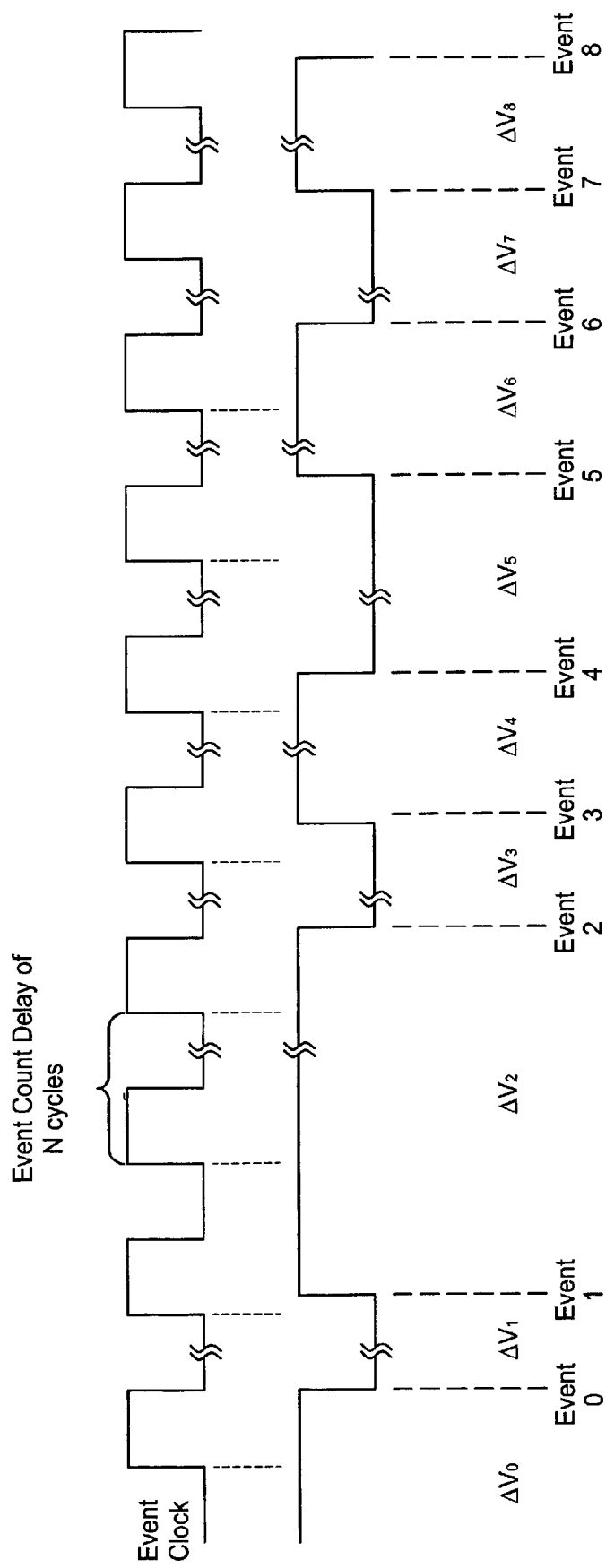
FIG. 4B is a waveform diagram showing sequence of events based on the event data of FIG. 4A.

FIG. 4A is a table showing a general example of event data stored in an event memory and FIG. 4B is a waveform diagram showing a sequence of events based on the event data of FIG. 4A where the frequency of the event clock is directly matched with that of processing clock. In this situation, because no parallel processing is conducted, the timing data in each and every event is defined by a set of event count data (integral of reference clock) and event vernier data (fraction of reference clock). Further, each event has the same weight (i.e., event description), thus, there is no distinction between a base event and a companion event as required in the parallel processing.

In the data table of FIG. 4A, each of the events E0–E8 (FIG. 4B) is a time difference from the immediately prior event. Such time differences are denoted by $\Delta V_0$, $\Delta V_1$, $\Delta V_2$, ... $\Delta V_8$ in the leftmost column of the data table of FIG. 4A and also shown in the waveform chart of FIG. 4B. Since each time difference is a time length between two adjacent events, such a time difference is expressed simply by a combination of the event count data and the event vernier data. The event count data C0–C8 is shown in a "Count" column and the vernier data V0–V8 is shown in a "Vernier" column of the table. "Event Type" column defines a type of event for each event such as "Drive Logical Low" (1 to 0) and "Drive Logical High (0 to 1).

For example, the event E2 is apart from the event E1 by $\Delta V_2$ and is defined by the event count data C2 (integral part value) and the vernier data V2 (fractional part value). Thus, the event E2 is expressed as $\Delta V_2 = C2 \times Tp + V2$, where Tp is a one cycle time length of the processing clock (event clock). Similarly, the event E3 is apart from the event E2 by $\Delta V_3$ and is defined by the event count data C3 (integral part value) and the vernier data V3 (fractional part value). Thus, the event E3 is expressed as $\Delta V_3 = C3 \times Tp + V3$. FIG. 4B shows the timing relationship among the events relative to the event clock (processing clock).

Figure 5:
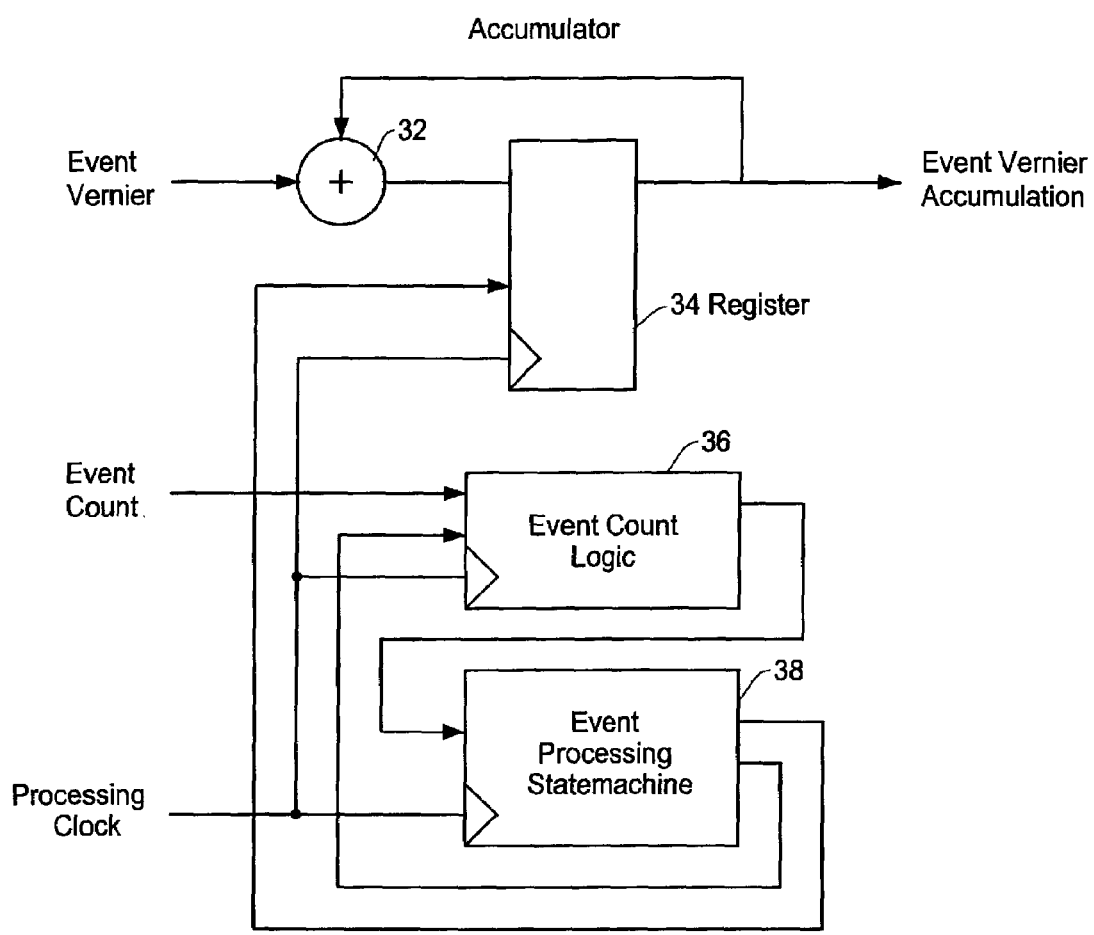
FIG. 5 is a block diagram showing an example of structure in the event summing logic for processing the event timings in the waveform of FIG. 4B based on the event data shown in the data table of FIG. 4A.

FIG. 5 is a block diagram showing an example of structure in the event summing logic for computing the event timings based on the event data shown in FIG. 4A to reproduce the timing relationship shown in the event waveforms of FIG. 4B. The event summing logic includes an accumulator formed of an adder 32 and a register 34, an event count logic 36 and an event processing state machine 38. The processing clock is commonly supplied to the state machine 38, the event count logic 36 and the register 34. The event count data from the event memory is provided to the event count logic 36, and the event vernier data from the event memory is provided to the adder 32. Detailed descriptions regarding the circuit configuration of the event summing logic and its operation is provided in the U.S. application Ser. No. 09/286,226 (now U.S. Pat. No. 6,557,133) noted above.

The event count logic 36 is, for example, a down counter which is preset by a numerical value expressed by the event count data. Thus, the event count logic 36 produces a terminal count pulse when the count result reaches zero by counting the number of processing clock. Upon receiving the terminal count pulse from the event count logic 36, the event state machine 38 produces valid data enable (enable signal) which is sent to the accumulator in synchronism with the processing clock. The accumulator accumulates the vernier data, and upon receiving the valid data enable from the event state machine 38, the accumulator produces the accumulated vernier data.

Thus, the accumulated vernier data is supplied to the event generator 24 (FIG. 1) at the timing defined by the event count data (valid data enable). The event generator 24 has a delay circuit which adds the delay time defined by the accumulated vernier data to the timing of the valid data enable. Details of the event generator is disclosed in the U.S. application Ser. No. 09/286,226 (now U.S. Pat. No. 6,557,133) owned by the same assignee of this invention.

Therefore, the event E2 for example, where the event count data is C2 and the event vernier data is V2, a terminal count pulse is produced by the event count logic 36 when counting the processing clock by C2 times. Upon receiving the terminal count pulse, the event state machine 38 produces the data enable (enable signal) which is sent to the accumulator. In the accumulator, the vernier data V2 is added to the prior vernier data and the resultant accumulated vernier data is produced at the timing of the data enable from the event state machine 38. Based on the event type data (such as drive high or drive low) from the event memory and the accumulated vernier data from the event summing logic, the event generator 24 produces the event E2 which is $\Delta V2$ apart from the event 1.

In the example of FIGS. 4A–4B and 5, since the timing of each event is defined by the time length from the immediately prior event, a set of the event count data and event vernier data is specified for each and every event. The event summing logic simply counts the processing clocks, and the vernier accumulation represents fractions of the processing clock cycle. In this example, however, when the event clock (reference clock for event timings) is different from the processing clock, events cannot be accurately produced by the data shown in FIG. 4A or by the circuit arrangement of FIG. 5. As noted above, in a typical test system, the frequency of the event clock is different from that of the processing clock and is much higher than the processing clock.

Therefore, to overcome this problem, in the present invention, event timing computation is performed through parallel processing of the vernier data. The parallel event processing achieves a high speed event generation with use of a processing clock of a relative slow speed. An example of timing relationship is illustrated by the waveforms shown in FIG. 6. In this example, the parallel processing is conducted in which the time period of each processing clock is twice as long as that of each event clock (1-to-2 parallel event processing). To achieve the required rate of generating events, each processing clock cycle must have two events. For performing the 1-to-2 parallel event processing shown in FIG. 6, the event memory stores the event data in a manner shown in FIG. 7A which is used by an event summing logic (event processing pipeline) of FIG. 7B.

Figure 6:
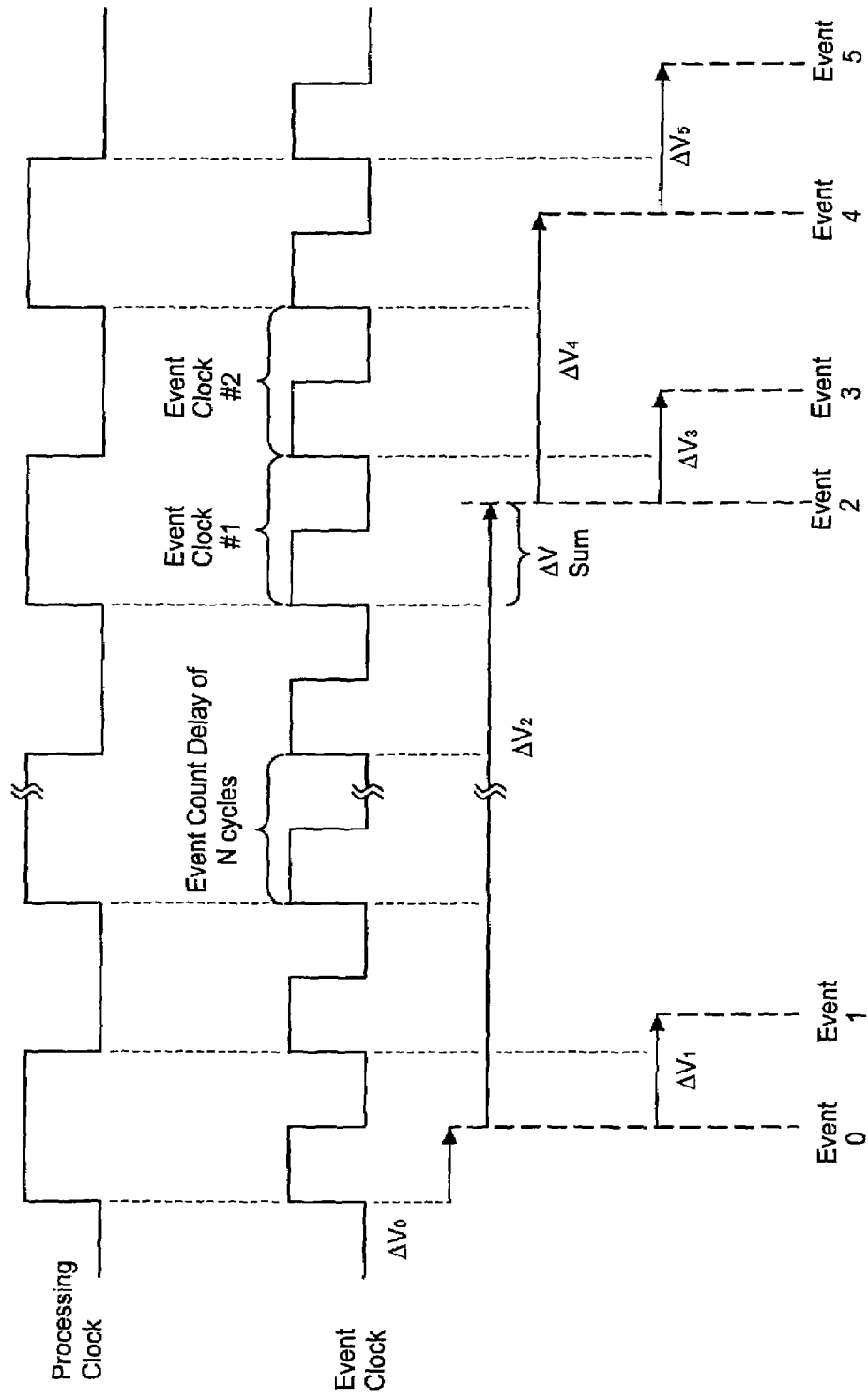
FIG. 6 is a waveform chart showing the parallel processing in the first embodiment of the present invention where the time period of each processing clock is twice as long as that of each event clock.

As shown in the waveform chart of FIG. 6, the timing of the event E1 is a time difference $\Delta V_1$ from the event E0 which is the same as in the example of FIG. 4A. However, the timing of the event E2 is a time difference $\Delta V_2$ from the event E0 unlike the example of FIG. 4A in which the time length is defined with reference to the event E1. Similarly, in FIG. 6, both the event E3 and event E4 are defined by the time differences $\Delta V_3$ and $\Delta V_4$, respectively, from the event E2.

Figures 7A, 7B:
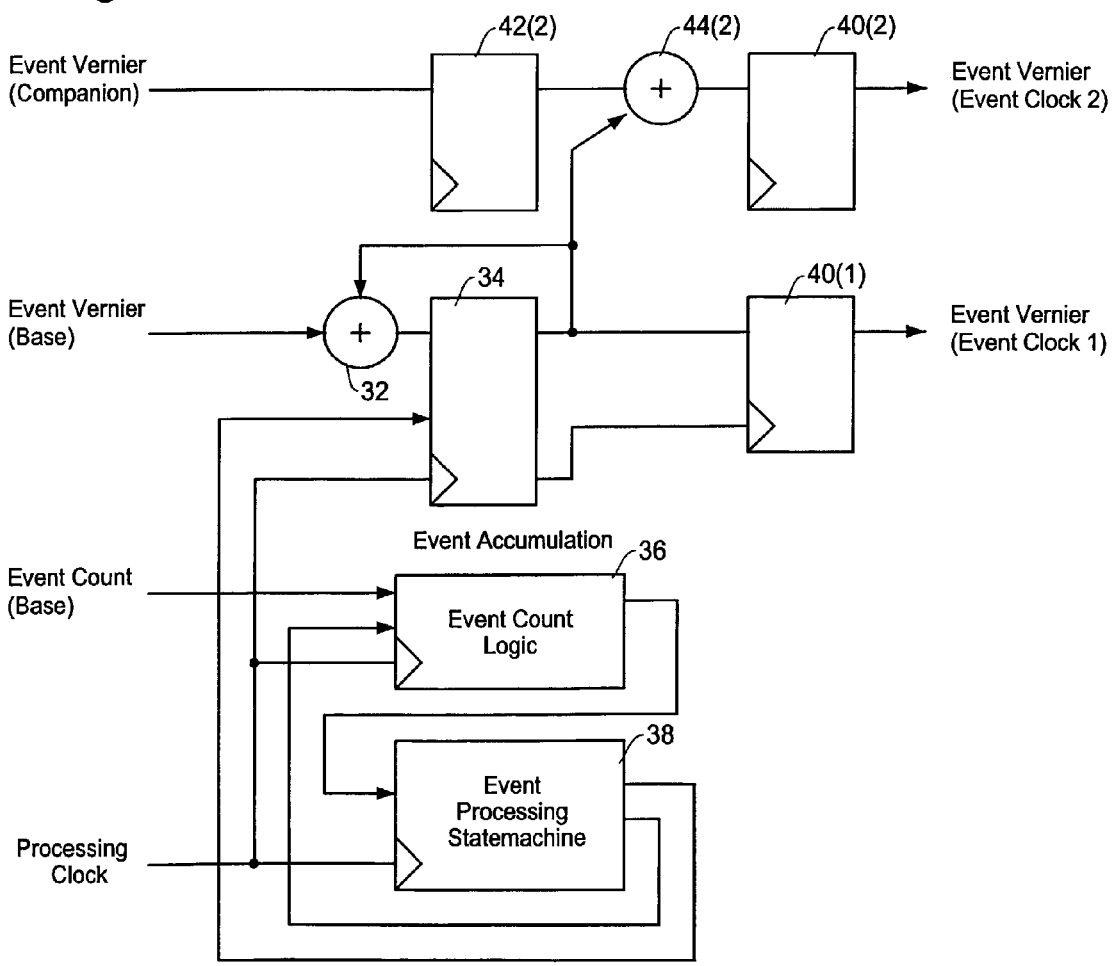
FIG. 7A is a data table showing an example of event data stored in the event memory and FIG. 7B is a block diagram for performing the 1-to-2 parallel event processing to produce the timing relationship shown in FIG. 6.

In the data table of FIG. 7A, the events E0, E2 and E4 are denoted as base events while the events E1, E3, E5 are denoted as companion events. The companion events are defined only by the vernier data, thus, no event count data is provided for the companion events E1, E3 and E5. The event count data (integral number of processing clock) of the base event is defined with reference to the prior base event (not the prior companion event). Thus, the event count data C2 of the event E2 is an integral number of processing clock cycle from the event E0.

In this manner, a group of base event and companion events is specified for producing parallel outputs of the accumulated vernier data. A group of the base event E0 and the companion event E1, a group of the base event E2 and the companion event E3, and a group of the base event E4 and the companion event E5 are respectively created as in the table of FIG. 7A. The event data for each group is processed in parallel and their accumulated vernier data is produced for the base event and the companion event in parallel as shown in the event summing logic of FIG. 7B.

As shown in FIG. 6, an actual timing of the base event is a sum of all of the prior base events. Thus, the timing of event E4 (base event) is a sum of timings of the events E0, E2 and E4, i.e., $\Delta V_0 + \Delta V_2 + \Delta V_4$. An actual timing of the companion event is a sum of all of the prior base events in addition to the vernier data of the current companion event. Thus, the timing of event E5 (companion event) is a sum of timings of the events E0, E2, E4 and E5, i.e., $\Delta V_0 + \Delta V_2 + \Delta V_4 + \Delta V_5$.

As noted above, the time difference of the base event is defined by a combination of the event count data and event vernier data. Thus, the time difference $\Delta V_0$ is defined by the event count data C0 and vernier data V0, the time difference $\Delta V_2$ is defined by the event count data C2 and vernier data V2, and the time difference $\Delta V_4$ is defined by the event count data C4 and vernier data V4. However, the time difference of the companion event is defined only by the vernier data. Thus, the time difference $\Delta V_1$ is defined by the vernier data V1, the time difference $\Delta V_3$ is defined by the vernier data V3, and the time difference $\Delta V_5$ is defined by the vernier data V5.

To compute the event timings in the example of FIGS. 6 and 7A, the event summing logic such as shown in FIG. 7B performs the 1-to-2 parallel processing. In the example of FIG. 7B, the event summing logic includes an accumulator formed of an adder 32 and a register 34, an event count logic 36 and an event processing state machine 38. As can be seen from FIG. 7B, with respect to the base events, the event summing logic has basically the same circuit configuration as that of FIG. 5. The event summing logic further includes an adder 44(2) for parallel processing the companion events. Registers 40(1), 40(2) and 42(2) are provided for re-timing the data processed in the circuit arrangement of the event summing logic.

In the event summing logic, the accumulated event vernier (vernier data of the prior and current base events accumulated to one another) is supplied to the adder 44(2) where it is added to the event vernier data for the companion event. The processing clock is commonly supplied to the event processing state machine 38, the event count logic 36 and the register 34. The event processing state machine 38 and the event count logic 36 are the same as those in FIG. 5.

In this arrangement, the base event and the companion event are processed in a parallel fashion, thereby producing the event timings in the speed of the event clock rather than the processing clock. For example, with respect to the events E2 and E3, the timing computation for these events are conducted in parallel. In this example, the event E2 is a base event having the event count data C2 and the event vernier data is V2, and the event E3 is a companion event having only the event vernier data. The vernier data of the event E3 (companion event) is added to the accumulated vernier data of the event E2 (base event).

With respect to the event E2, the event count data C2 is supplied to the event count logic 36 which counts the processing clock and produces a terminal count pulse when the results of down count reaches zero, i.e, counting the processing clock by C2 times. Upon receiving the terminal count pulse, the event processing state machine 38 produces valid data enable (enable signal), in synchronism with the processing clock, which is sent to the accumulator. The event vernier data for the base events is provided to the accumulator so that the vernier data of the prior base events and the event E2 are accumulated, thereby producing the accumulated vernier data for the event E2 through the register 40(1). Thus, the accumulated vernier data for the event E2 is produced at the timing determined by the event count data C2.

The accumulated vernier data for the event E2 is further added to the event vernier data for the event E3 by the adder 44(2), thereby producing the accumulated vernier data for the event E3 through the register 40(2). The accumulated vernier data for the event E3 is produced as soon as the accumulated vernier data for the event E2 is produced. In this manner, since the accumulated vernier data for the events E2 and E3 are produced in a parallel form as shown in FIG. 7B, such accumulated vernier data can be processed by the event generator by the timing of the event clock. This is illustrated as an event clock 1 and an event clock 2 in FIG. 7B.

Figure 8:
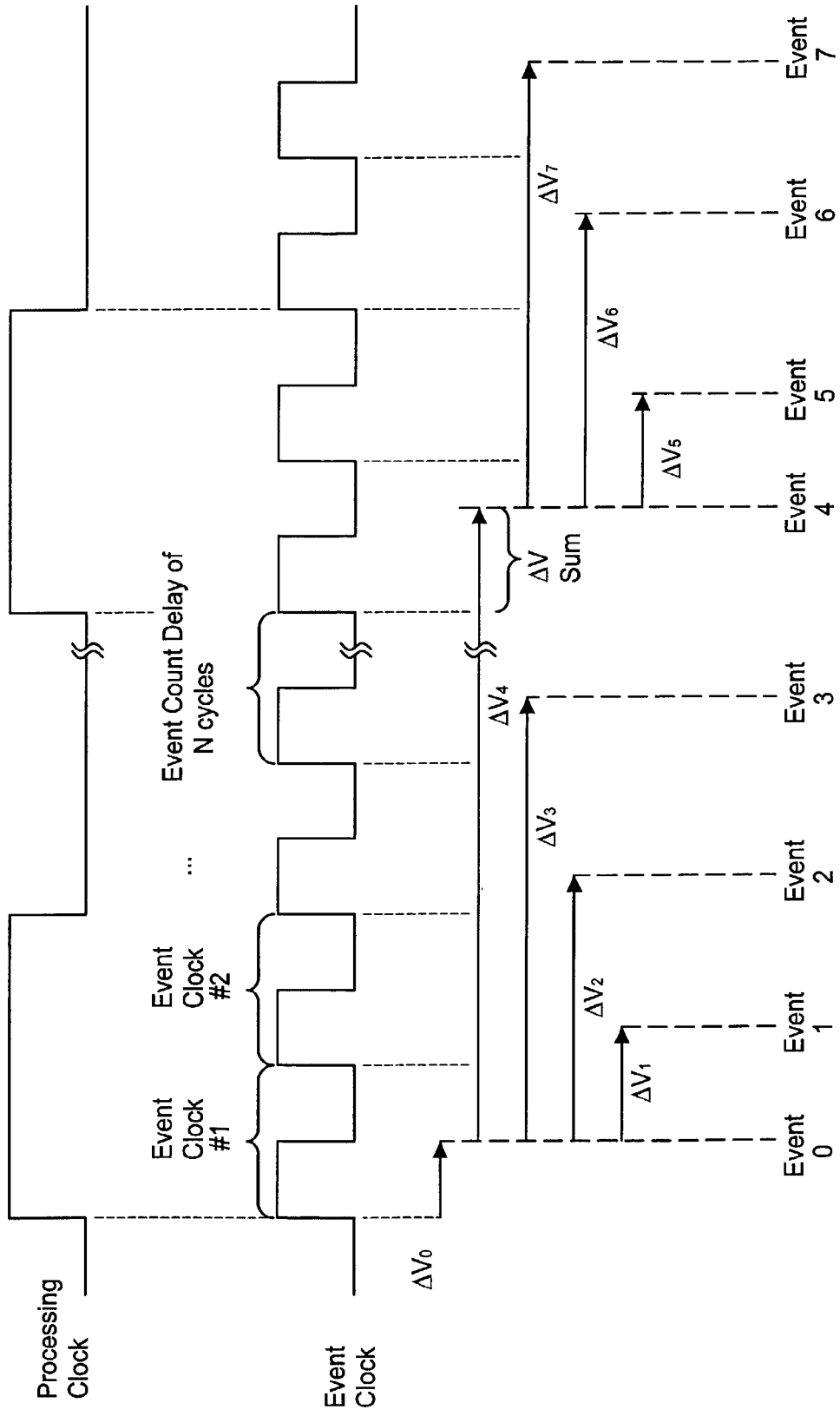
FIG. 8 is a waveform chart showing the parallel processing in the first embodiment of the present invention where the time period of each processing clock is four times as long as that of each event clock.
Figure 10:
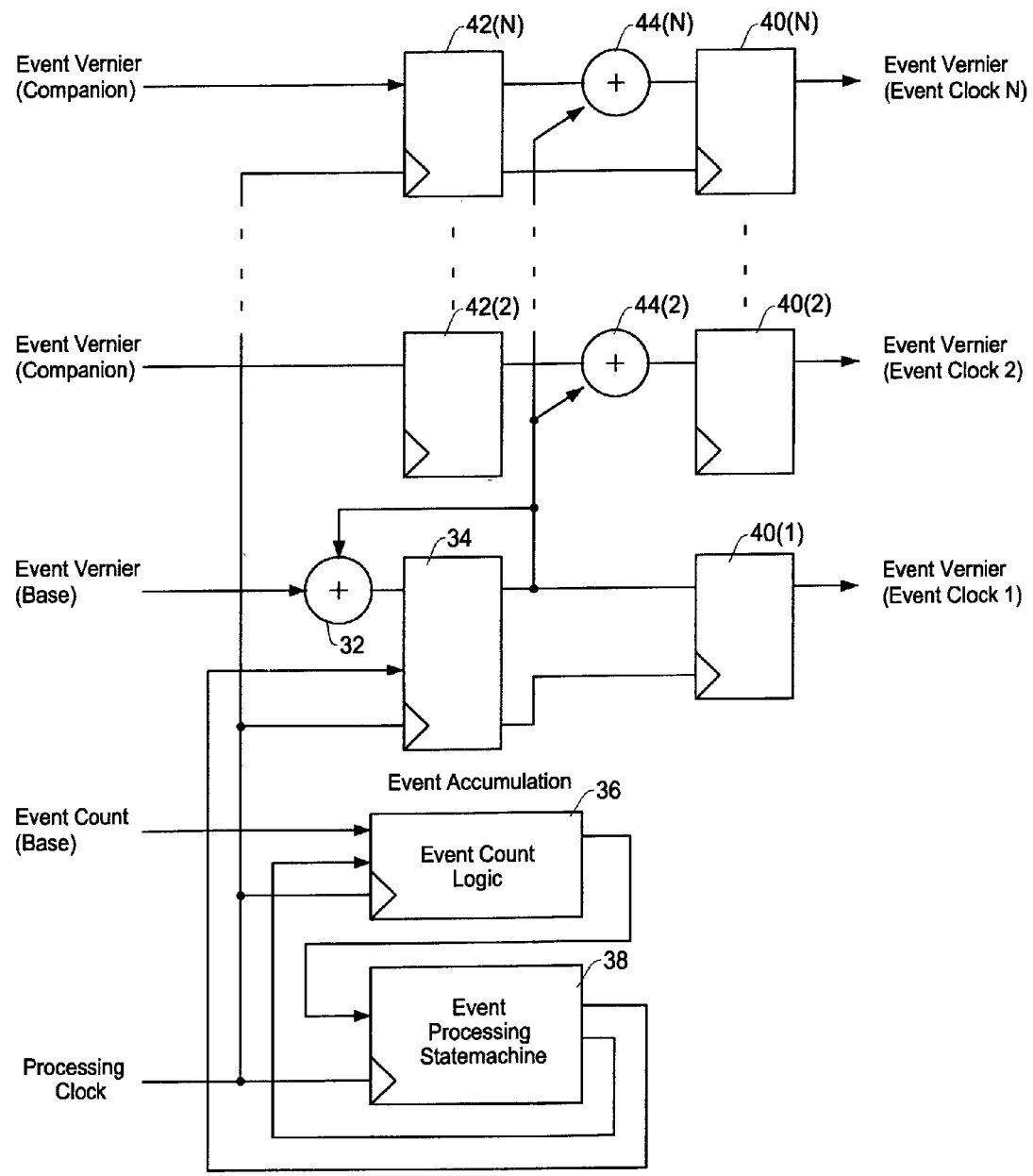
FIG. 10 is a block diagram showing an example of structure in the event summing logic for performing the 1-to-N parallel event processing in the first embodiment of the present invention.

Another example of the parallel event processing in the present invention is shown in FIGS. 8–10 in which the time period of each processing clock is four times as long as that of each event clock (1-to-4 parallel processing). The waveform of FIG. 8 shows an example of such 1-to-4 parallel event processing and the data table of FIG. 9 shows an example of event data stored in the event memory for producing the waveform of FIG. 9. The circuit diagram of FIG. 10 generalizes an event summing logic for performing the 1-to-N parallel event processing where N-1 adders are provided in parallel with the accumulator for the base events. In this case, to achieve the required rate of generating events, each processing clock cycle must have four events.

As shown in the waveform chart of FIG. 8, the timing of the event E1 is a time difference $\Delta V_1$ from the event E0 which is the same as in the example of FIG. 4A. The timings of the event E2 and E3 are time differences $\Delta V_2$ and $\Delta V_3$ each also being defined from the event E0. In FIG. 9, the event data for the event E0 is formed of a set of event count data C0 and event vernier data V0. The event data for the events E1, E2 and E3 is formed of only by vernier data V1, V2 and V3, respectively. In other words, the event E0 is a base event while the events E1, E2 and E3 are companion events where a group of one base event (event E0) and three companion events (events E1–E3) are parallel processed in the present invention. Similarly, in FIG. 8, the event E4 is a base event described by the event count data C4 and the event vernier data V4 while the events E5, E6 and E7 are companion events described only by the vernier data V5, V6 and V7. Thus, a group of one base event (event E4) and three companion events (events E5–E7) are parallel processed in the present invention.

As shown in FIG. 8, an actual timing of the base event is a sum of all of the prior base events. Thus, the timing of event E4 (base event), for example, is a sum of timings of the base events E0 and E4, i.e., $\Delta V_0 + \Delta V_4$. An actual timing of the companion event is a sum of all of the prior base events in addition to the vernier data of the current companion event. Thus, the timing of event E5 (companion event), for example, is a sum of the timings of the events E0, E4 and E5, i.e., $\Delta V_0 + \Delta V_4 + \Delta V_5$.

To compute the event timings in the foregoing example, the event summing logic of FIG. 10 is constituted for 1-to-N parallel processing. In this circuit diagram, the accumulator formed of the adder 32 and the register 34, the event count logic 36 and the event processing state machine 38 are basically the same as those shown in FIGS. 5 and 7B. As can be seen from FIG. 10, the event summing logic further includes adders 44(2)–44(N) for parallel processing the N events (for each group) at the same time. Registers 40(1) –40(N) and 42(2)–42(N) are provided for re-timing the data processed in the circuit arrangement.

In the event summing logic of FIG. 10, the accumulated event vernier (vernier data of the prior and current base events accumulated to one another) is supplied to the adders 44(2)–44(N) where it is added to the event vernier data for the corresponding companion event. In this arrangement, the base event and the companion event are processed in a parallel fashion, thereby producing the event timings for the group having N events at the same time. Thus, even when the processing clock is slower than the event clock by 1/N, the accumulated vernier data can be obtained at the rate of the event clock through the parallel outputs of the event summing logic.

Figure 11:
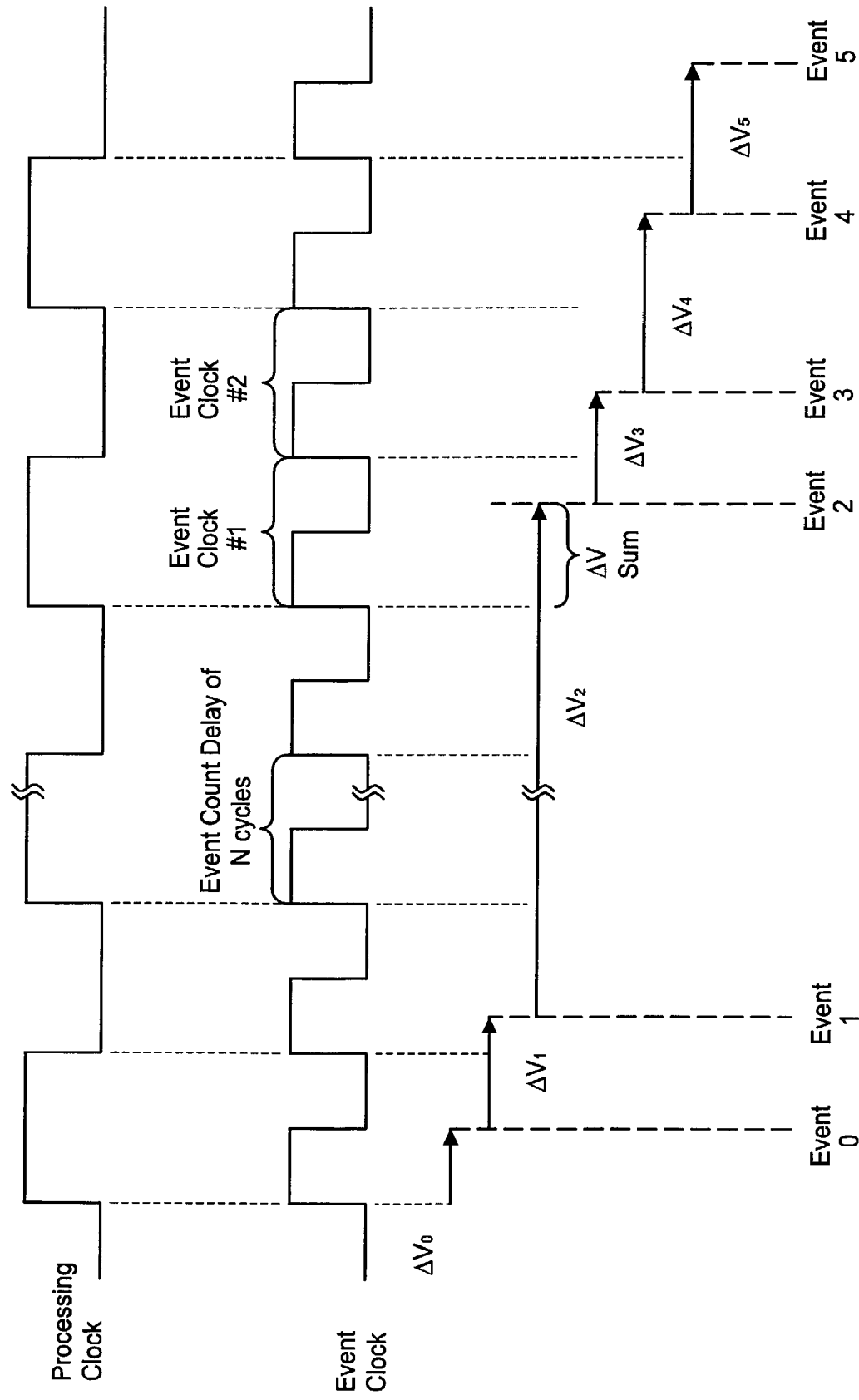
FIG. 11 is a waveform chart showing serial event processing in the second embodiment of the present invention where the time period of each processing clock is twice as long as that of each event clock.
Figure 13:
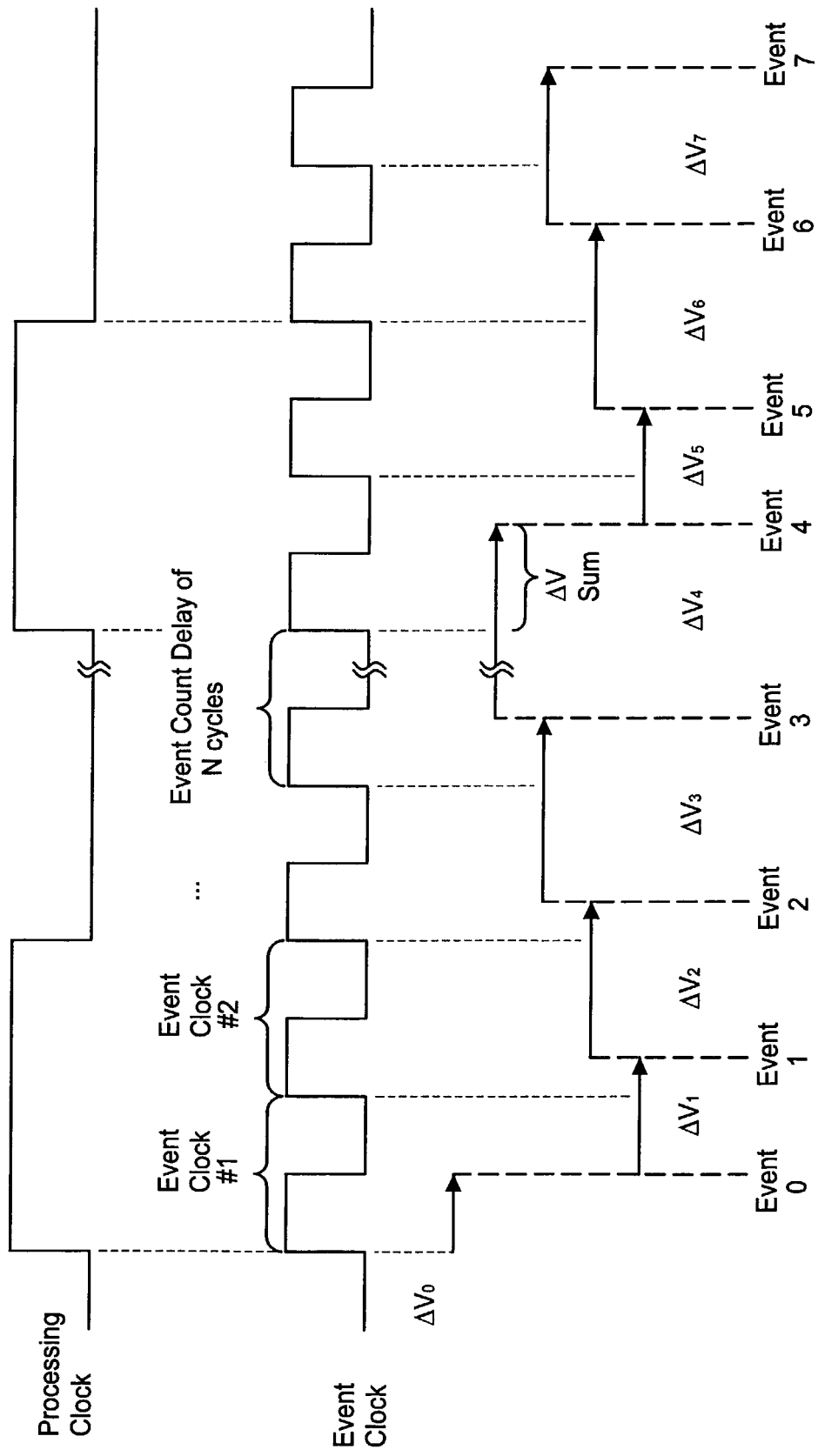
FIG. 13 is a waveform chart showing the serial event processing in the second embodiment of the present invention where the time period of each processing clock is four times as long as that of each event clock.
Figure 15:
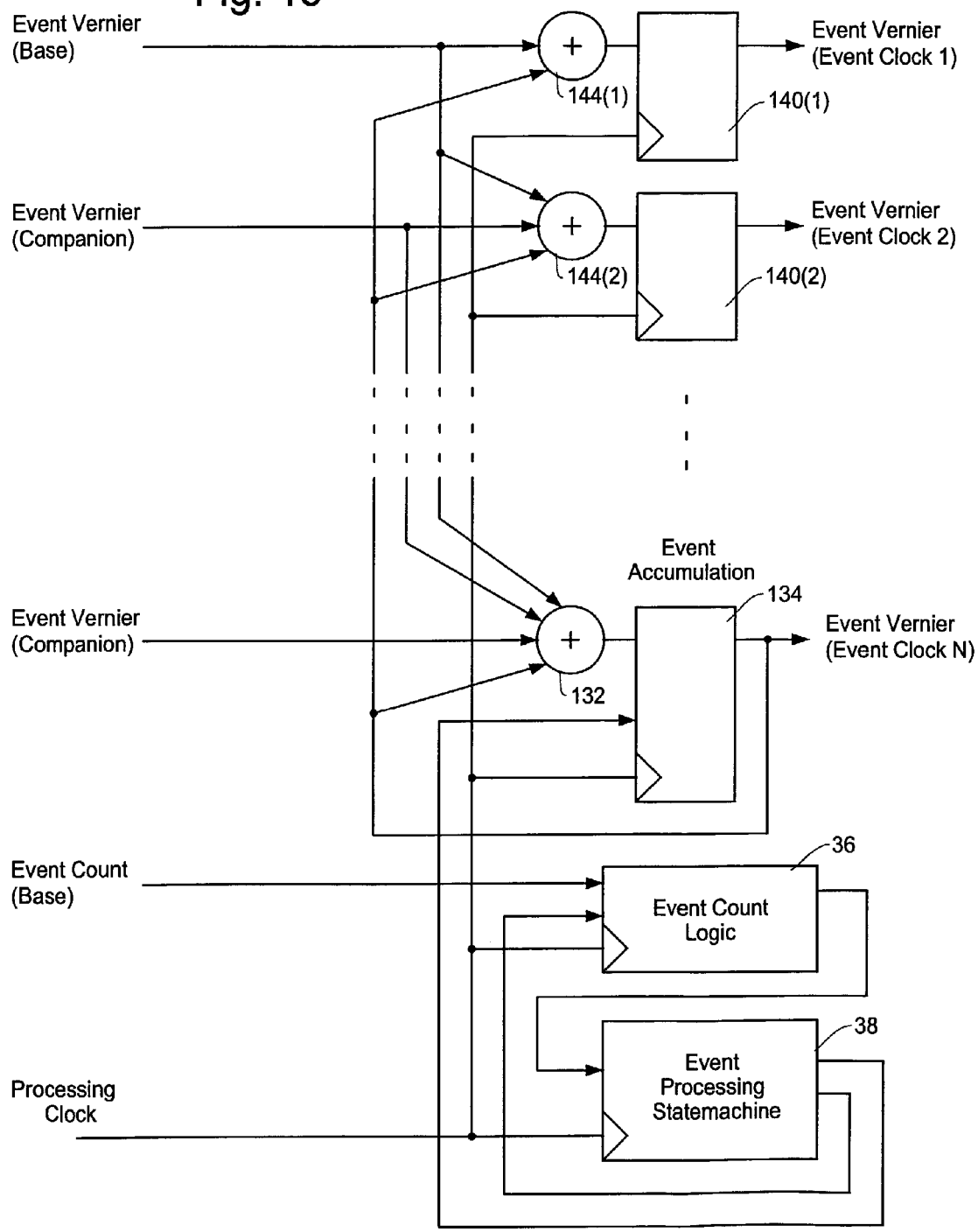
FIG. 15 is a block diagram showing an example of structure in the event summing logic for performing the 1-to-N serial event processing in the second embodiment of the present invention.

FIGS. 11–15 show the second embodiment of the present invention where the parallel processing involves a serial accumulation process of a group of base event and companion events. FIGS. 11 and 12 show an example in which each processing clock is twice as long as each event clock. FIGS. 13 and 14 show an example in which each processing clock is four times as long as each event clock. An example of structure of an event summing logic for performing the timing computation is shown in FIG. 15. In the parallel processing shown in FIGS. 6–10, the vernier data for each companion event is defined only with reference to the base event. In other words, the vernier data for each companion event is unrelated to the vernier data of the other companion events as shown in FIG. 8. Therefore, in the first embodiment, a pure parallel process can produce the accumulated vernier data for a group of base event and companion events in parallel.

In the second embodiment shown in FIGS. 11–15, however, vernier data for each companion event is defined as a time length from an immediately prior event in a manner similar to the example of FIGS. 4A and 4B. In the example of FIGS. 11–15, the companion event is described only by the vernier data which is a time length from the immediately prior event, and the base event is described by a combination of the event count data and the event vernier data. Consequently, serial processing for the vernier data must be conducted within each group of the base event and companion events. In the second embodiment, since each companion event is defined as a time length from the immediately prior event, it is expected that a number of data bits for the vernier data can be small since such a time difference between two adjacent events can be small.

In the example of FIGS. 11 and 12 where each processing clock is twice as long as each event clock, two outputs (accumulated vernier data) will be produced in parallel while each event data is accumulated in a serial fashion. As shown in the waveform chart of FIG. 11 and data table of FIG. 12, the timing of the event E1 is a time length $\Delta V_1$ from the event E0 as in the example of FIG. 4A. The timing of the event E2 is a time length $\Delta V_2$ from the event E1, and the timing of event E3 is a time length $\Delta V_3$ from the event E2, and so on.

In this manner, the timing of each event is defined by the immediately prior event. However, unlike the example of FIGS. 4A and 4B, there is a distinction between the base event and the companion event. A group consisting of a base event and companion events is specified for producing parallel outputs of the accumulated vernier data as shown in the event summing logic of FIG. 15.

In FIG. 12, the event data for the event E0 is formed of a set of event count data C0 and event vernier data V0, and the event data for each of the events E2 and E4 is also formed of a set of event count data and event vernier data, i.e., C2 and V2, and C4 and V4, respectively. However, the events E1, E2 and E3 are defined only by vernier data V1, V3 and V5, respectively. In other words, the events E0, E2 and E4 are base events while the events E1, E3 and E5 are companion events.

Because of the 1-to-2 relationship, to produce the accumulated vernier data at the rate of the event clock, the event summing logic produces two parallel outputs, one for base event and another for companion event. In the case where there is the 1-to-4 relationship, the event summing logic produces four parallel outputs, one for base event and other three for companion events. Thus, to cover the 1-to-N relationship, in the circuit diagram of FIG. 15, N outputs are produced as will be described in more detail later. In the example of FIGS. 11–15, however, unlike the embodiments shown in FIGS. 7B or 10 which involve only the pure parallel processing, the timing computation further involves the serial processing because the event timing for each event is defined as a time difference from the immediately prior event.

In the example of FIGS. 13 and 14 where each processing clock is four times as long as each event clock, four outputs (accumulated vernier data) will be produced in parallel while each event data is accumulated in a serial fashion. As shown in the waveform chart of FIG. 13 and the data table of FIG. 14, the timing of the event E1 is a time length $\Delta V_1$ from the event E0 as in the example of FIG. 4A. The timing of the event E2 is a time length $\Delta V_2$ from the event E1, and the timing of event E3 is a time length $\Delta V_3$ from the event E2, and so on.

In this manner, the timing of each event is defined as a time difference from the immediately prior event. In FIG. 14, the event data for the event E0 is formed of a set of event count data C0 and event vernier data V0, and the event data for the event E4 is also formed of a set of event count data C4 and event vernier data V4. However, the events E1, E2 and E3 are defined only by event vernier data V1, V2 and V3, respectively. Similarly, the events E5, E6 and E7 are defined only by event vernier data V5, V6 and V7, respectively.

In other words, the events E0 and E4 are base events while the events E1–E3 and E5–E7 are companion events. Events in a group consisting of one base event (event E0) and three companion events (events E1–E3) are parallel processed in the present invention. Similarly, events in another group consisting of one base event (event E4) and three companion events (events E5–E7) are parallel processed in the present invention.

In FIG. 15, the event summing logic includes an event count logic 36, an event processing state machine 38, an event accumulator composed of an adder 132 and a register 134, adders 144(1)–144(1-N), and registers 140(1)–140(N-1) The event count logic 36 and the event processing state machine 38 are basically the same as those shown in FIGS. 7B and 10. However, unlike the previous examples in FIGS. 7A and 10, the accumulator accumulates all of the vernier data, either companion events or base events, to produce the N-th accumulated vernier data.

The adder 144(1) adds the vernier data of the base event to the N-th accumulated vernier data from the accumulator. The adder 144(2) adds the vernier data of the base event and the first companion event to the N-th accumulated vernier data from the accumulator. Similar summing process is conducted for all of the remaining companion events. Thus, the event summing logic of FIG. 15 performs the serial processing while producing the N parallel outputs.

As has been described in the foregoing, this method achieves a higher event processing rate by using multiple verniers per processing clock cycle. Thus, even when the processing clock is slower than the event clock by 1/N, the accumulated vernier data can be produced at the rate of the event clock through the N parallel outputs. The number of companion events in each group is equal to the number of event clocks in the processor clock cycle minus the event clock which is associated with the base event. It should be noted that this method is scalable to any speed event clock. Further, the method assumes that there is one event (base or companion) for each event clock cycle.

Figure 1:
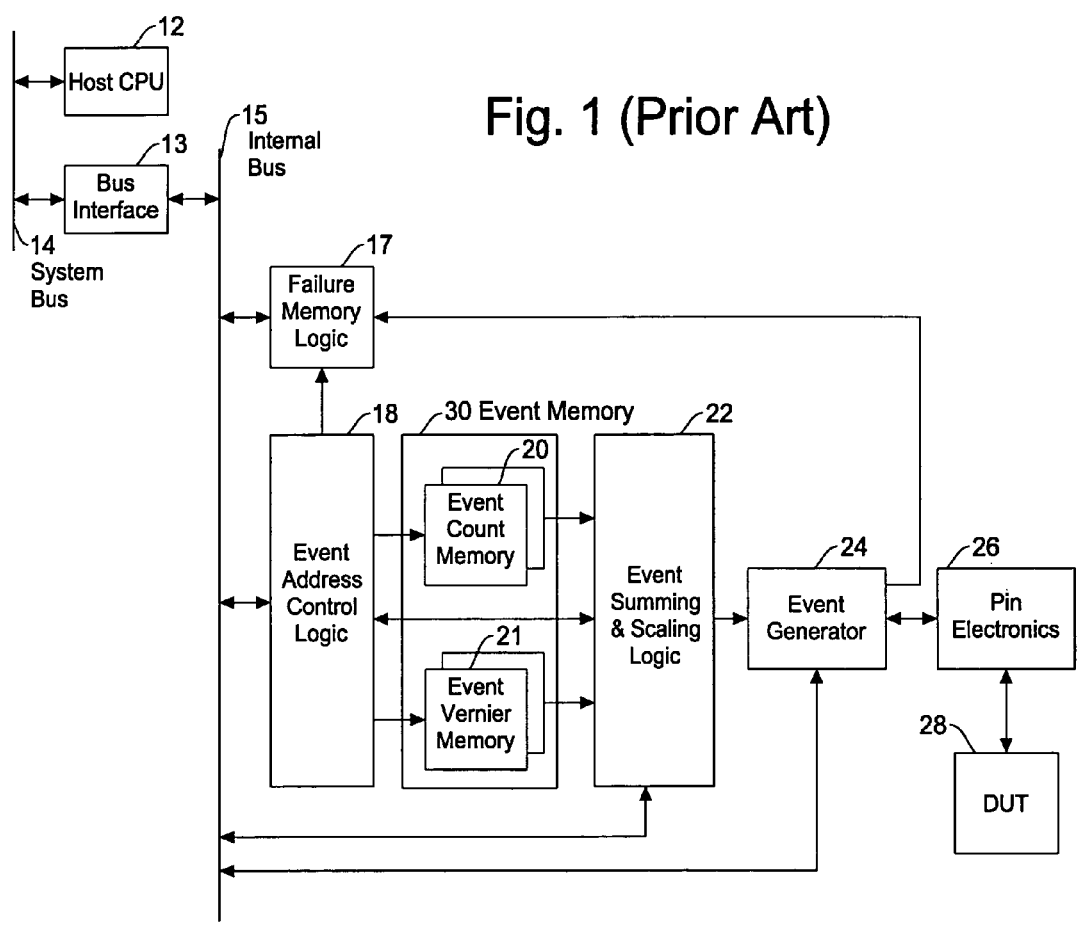
FIG. 1 is a schematic block diagram showing a basic structure of an event based test system for incorporating the event processing apparatus and method of the present invention.

The third embodiment of the present invention is directed to the resolution of the vernier data values, i.e., event edge placement resolution. The resolution of the vernier values depends upon how an event generator (such as shown in FIG. 1) interprets these values. An example of structure of an event generator is disclosed in the U.S. application Ser. No. 09/406,300 (now U.S. Pat. No. 6,532,561). The vernier values (accumulated vernier data) such as from the event summing logic of FIGS. 10 or 15 will be supplied to variable delay circuits (event delay logic) in the event generator. The event delay logic produces delay times specified by the vernier data with high timing resolution. As is known in the art, such delay times are produced by variable delay circuits which are typically constituted by a series connected CMOS gates.

The event generator can treat all incoming vernier data values as being fractions of the processing clock cycle. This would be the case when the event generator's own processing clock is the same frequency as that of the event processing pipeline (e.g. event summing logic described above) as shown in the block diagram of FIG. 16. This block diagram shows basic elements in an event based test system which includes an event memory for storing event data such as shown in the data tables in the foregoing embodiments, an event processing pipeline 122 which includes the event summing logic described above, and an event generator 124 for generating events such as drive events and sampling events.

Figures 16, 17, 18:
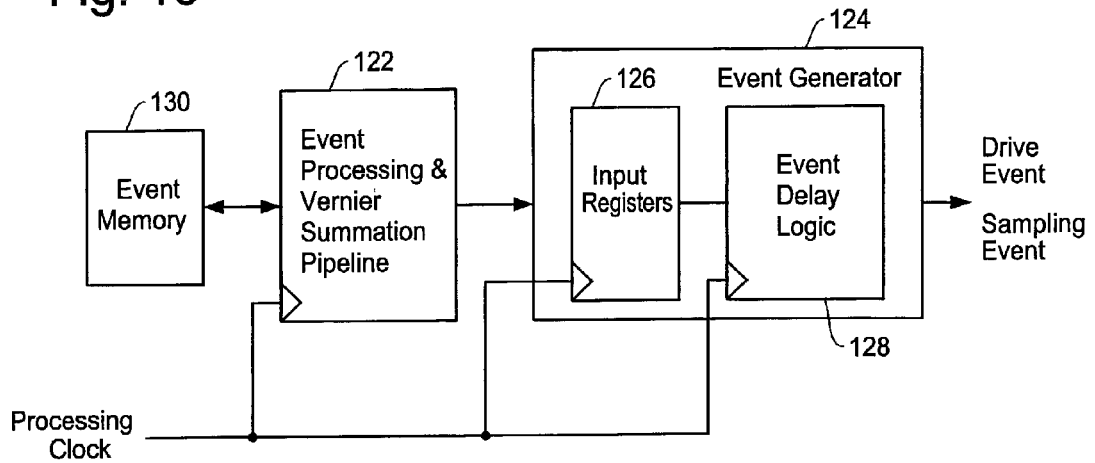
FIG. 16 is a block diagram showing an example of structure in the event based test system where an event generator treats the event vernier values as being fractions of the processing clock cycle.
FIG. 17 is a table showing the timing resolution of the vernier data with fixed vernier bits when the vernier bits are a fraction of the processing clock and when the event generator is configured as shown in FIG. 16.
FIG. 18 is a table showing the timing resolution of the vernier data with variable vernier bits when the vernier bits are a fraction of the processing clock and when the event generator is configured as shown in FIG. 16.

In the example of FIG. 16, the vernier values (accumulated vernier data) are first registered before being sent directly to the event delay logic (variable delay circuit). The event delay logic must provide delays that will span an entire processing clock period since there are no other higher speed clocks to provide higher timing granularity. This means that the vernier data bits must be able to encompass the entire processing clock period while maintaining the desired timing resolution.

The table in FIG. 17 illustrates the vernier resolution (timing resolution for drive events and sampling events) when fixed number of vernier bits are used. Here, it should be noted that resolution is equal to a time period of pipeline clock (processing clock) divided by the number of vernier bits. As an example, for a processing clock of 125 MHz, time period (one cycle time length) is 8 ns. In this case, since fixed 7-bits of vernier data represent 8 ns, the timing resolution is 62.5 ps. For a processing clock of 250 MHz, the time period (one cycle time length) is 4 ns, hence, the timing resolution is 31.25 ps by the fixed 7-bits of vernier data.

The table in FIG. 17 shows the case where the timing resolution based on the processing clock is fixed (i.e, processing clock of 250 MHz and vernier data of fixed 7-bits) regardless of the event clock frequency. As shown in this table, then the processing (pipeline) clock frequency is 125 MHz, the timing resolution by the fixed 7-bits vernier data is 62.50 pS (picosecond). When the processing clock frequency is 250 MHz, the timing resolution by the fixed 7-bits vernier data is 31.25 pS.

Thus, in this case, no matter how the event clock frequency is higher than the processing clock such as 500 MHz to 1.5 GHz, the timing resolution is unchanged. The column "Vernier per Clock" indicates the number of parallel outputs in the event summing logic shown in FIGS. 10 and 15. This means that, in the case of the table shown in FIG. 17, the event timing computation can produce the vernier data by the parallel processing so that it can be used at the rate of the event clock, however, the timing resolution is limited to the processing clock.

The resolution of the test system can be improved by increasing the vernier bits as the event clock frequency rises. The table of FIG. 18 illustrates such alternative when variable vernier bits are used. As the table of FIG. 18 shows, the resolution can be improved by using more vernier bits. For example, when the processing (pipeline) clock frequency is 250 MHz and the event clock frequency is 500 MHz, the timing resolution can be 15.63 pS if the vernier data is defined by 8-bits. When the processing (pipeline) clock frequency is 250 MHz and the event clock frequency is 1.5 GHz, the timing resolution can be 3.91 pS if the vernier data is defined by 10-bits.

The table of FIG. 18 requires that the vernier delay logic in the event generator must add bits to compensate for the difference between the processing clock frequency and the event placement accuracy. This means that the processing logic in the event generator 128 in FIG. 16 as well as the event summing logic in FIGS. 10 and 15 must be expanded or modified each time the event frequency rises. Further disadvantages in the foregoing way of vernier usage is that since the vernier values are a fraction of the processing clock cycle, all logic run at a lower speed because the frequency of the processing clock is much lower than that of the event clock.

The disadvantages of the above method can be overcome if the event generator can treat all incoming vernier values as being fractions of the event clock cycle. This would be the case when the event generator's own processing clock is the same frequency as that of the event clock frequency by multiplying the processing clocks. In this case, the event processing logic will process the data using a clock frequency that is slower than the event clock rate but performing calculations that simulate the processing of the event data at the event clock rate.

Figure 19:
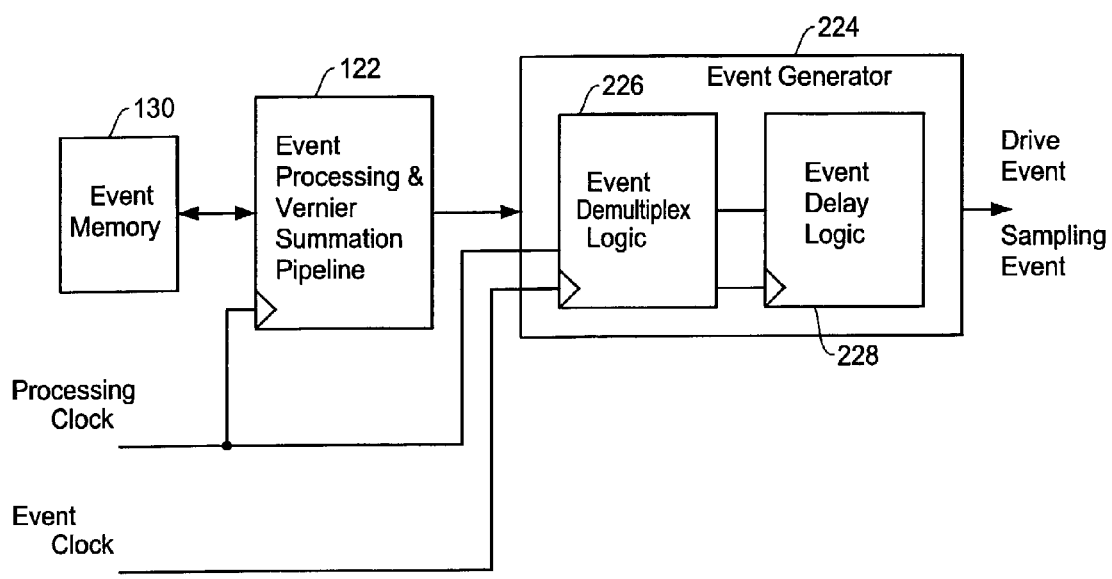
FIG. 19 is a block diagram showing an example of structure in the third embodiment of the present invention where an event generator treats the event vernier values as being fractions of the event clock cycle.

FIG. 19 shows an example of this type of system in which an event demultiplexing logic utilizes the processing (pipeline) clock as a data input to synchronize the demultiplexing operation to the processing clock cycle. More specifically, an event generator 224 includes an event demultiplex logic 226 and an event delay logic 228. The event demultiplex logic 226 receives two or more accumulated vernier values from the event processing pipeline (event summing logic) 122 in a parallel fashion at the rate of the processing clock and produces a serial output which has the rate of the event clock, i.e., it performs parallel-to-serial conversion.

As to the circuit configuration, the event delay logic 228 is equivalent to the event delay logic 128 in FIG. 16 to produce a fine delay time specified by the accumulated vernier data. However, the event delay logic 228 operates at the rate of the event clock to produce a delay time specified by each of the vernier values produced in a serial fashion at the output of the event demultiplex logic 226. As is known in the art, such delay times are produced by variable delay circuits which are typically constituted by a series connected CMOS gates.

In the example of FIGS. 20A–20E, the event generator performs 1-to-2 event demultiplexing, thereby increasing the timing resolution by two times. In the example of FIGS. 21A–21G, the event generator performs 1-to-4 event demultiplexing, thereby increasing the timing resolution by four times. In FIGS. 20A–20E, the event clock of FIG. 20B has a frequency which is two times higher than that of the processing clock of FIG. 20A. The event demultiplex logic 228 receives, in a parallel fashion, the accumulated vernier data V0, V2, V4, . . . for the base event as shown in FIG. 20C and the accumulated vernier data V1, V3, V6, . . . for the companion event as shown in FIG. 20D.

Such a parallel form of the accumulated vernier data will be supplied from the event summing logic of FIG. 7B which performs 1-to-2 parallel processing. The event demultiplex logic 226 produces the demultiplexed vernier data at the repetition rate of the event clock as shown in FIG. 20E. In other words, the vernier data received in synchronism with the processing clock in the parallel form is output in synchronism with the event clock in the serial form. Accordingly, the event generator 224 is able to produce a delay time with the timing resolution based on the event clock, which is two times higher than the original timing resolution.

In FIGS. 21A–21G, the event clock of FIG. 21B has a frequency which is four times higher than that of the processing clock of FIG. 21A. The event demultiplex logic 226 receives vernier data for the base event and companion events in parallel. Namely, the demultiplex logic 226 is provided with the accumulated vernier data V0, V4, V8, . . . for the base event as shown in FIG. 21C and the accumulated vernier data V1, V5, V9, . . . for the first companion event as shown in FIG. 20D. The demultiplex logic 226 is further provided with the accumulated vernier data V2, V6, V10, . . . for the second companion event as shown in FIG. 21E and the accumulated vernier data V3, V7, V11, . . . for the third companion event as shown in FIG. 20D.

Such a parallel form of the accumulated vernier data will be supplied from the event summing logic of FIG. 10 which performs 1-to-4 parallel processing. The event demultiplex logic 226 produces the demultiplexed vernier data at the repetition rate of the event clock as shown in FIG. 21G. In other words, the vernier data received in synchronism with the processing clock in the parallel form is output in synchronism with the event clock in the serial form. Accordingly, the event generator 224 is able to produce a delay time with the timing resolution based on the event clock, which is four times higher than the original timing resolution.

The table in FIG. 22 summarizes the effect of the third embodiment of the present invention in which the resolution of the vernier bits is tied to the event clock speed rather than the processing clock. By doing so, the fixed bits of vernier data will always provide the same data resolution. Since vernier data is generated at the event clock speed, the resulting timing resolution of each vernier value will increase with the increase of the event clock speed as shown in the table. For example, when the processing (pipeline) clock frequency is 250 MHz and the event clock frequency is 500 MHz, the timing resolution is 15.63 pS by the fixed 7-bits vernier data. When the processing (pipeline) clock frequency is 250 MHz and the event clock frequency is 1.5 GHz, the timing resolution is 5.21 pS by the 7-bits vernier data.

This type of vernier usage shown in FIGS. 19–22 has the advantages that (1) the vernier values are still a fraction of an event clock cycle, and (2) only the event generator must run at the event clock speed. For example, when implementing in an actual system, this method allows the vernier data to be transferred between chips at a slow speed and be converted to a high-speed domain within the event generator chip. Accordingly, in the present invention, each event processing pipeline only needs to process data to a fixed number of bits regardless of the event clock frequency. Multiple identical pipelines would then be created to gain the necessary number verniers.

The processing methods in the third embodiment of the present invention require the use of multiple vernier events during each processing clock cycle. In an actual test, the use of the verniers depends upon the timing of a specific pin of a device under test (DUT). For example, a clock pin will require a higher event rate than a data bus pin. This means that some of the vernier values will provide delay but must otherwise not generate an event (such as a drive event and sampling event) at the DUT's pin.

This can be achieved by inserting no-operation (NOP) events in the event data stored in the event memory. Typically, such NOP events are specified as an event type in the event data. These NOP events allow the vernier delay value to be used without causing a change to the state of the specified DUT's pin. FIGS. 23 and 24A–24G illustrate an example of such modification based on the multiplexed event clocks for such an application. The table in FIG. 23 shows an example of event data stored in the event memory and the timing charts of FIGS. 24A–24G show the effect of inserting the NOP events in accordance with the present invention.

The event generator receives the event type data from the event memory to determine the type of event to be produced at its output. In the example of FIGS. 23 and 24A–24G, the event generator produces an event of a rising edge (drive high) or a falling edge (drive low) having a delay time defined by the accumulated vernier data. When the event type data is NOP, the event generator produces a NOP event having only the specified delay without involving the changes in the logic state.

In the waveforms shown in FIGS. 24A–24G, the timing relationship shown in FIGS. 24A–24E is basically the same as that of FIGS. 20A–20E since it shows the case of the 1-to-2 demultiplexing. As shown in FIG. 24H, the event type data demultiplexed by the event demultiplex logic 226 in the event generator of FIG. 19, shows the event type data in the sequence of the event clock. The event type data in FIG. 24H corresponds to that shown in the table of FIG. 23 such as drive high (Drv 1), drive low (Drv 0) and NOP. It should be noted that, instead of the NOP event, the same effect can be achieved by replacing the NOP event with a longer event count on the base event.

According to the present invention, the event timing processing for a high speed event based semiconductor test system can be performed to produce the vernier data at the rate of an event clock with use of a processing clock which is much slower than the event clock. The event processing apparatus performs a parallel event processing with use of the processing clock thereby producing accumulated vernier data at the rate of the event clock.

Further, in the present invention, the event based test system is able to produce delay times of high timing resolution corresponding to the event clock with use of the processing clock. The event generator in the event based test system receives a plurality of vernier data values received in a parallel form at the rate of processing clock and producing the vernier data values in a serial form at the rate of the event clock thereby achieving the timing resolution matches with the event clock.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event processing apparatus for use with an event based test system for testing a semiconductor device under test (DUT), comprising:
    an event memory for storing event data of each event where the event data includes timing data for each event which is formed with event count data which is an integer multiple of a clock period and event vernier data which is a fraction of the clock period;
    an event summing logic for accumulating the timing data and producing the accumulated timing data of an event in a parallel form; and
    an event generator for generating events specified by the event data based on the accumulated timing data received in the parallel form from the event summing logic;
    wherein the events in the event data are specified as groups of events where each group of event is configured by one base event and at least one companion event; and
    wherein the clock period is a one cycle time length of a processing clock which is a reference clock for operating hardware of the event processing apparatus, and wherein the event summing logic produces the accumulated timing data at a plurality of outputs in the parallel form thereby enabling to produce the events at a rate of an event clock which has a frequency higher than the processing clock.

2. An event processing apparatus as defined in claim 1, wherein the event data stored in the event memory includes event type data for each event to specify a type of event to be produced by the event generator.

3. An event processing apparatus as defined in claim 1, wherein the timing data for the base event is formed of a set of the event count data and the event vernier data while the timing data for the companion event is formed solely of the event vernier data.

4. An event processing apparatus as defined in claim 1, wherein the accumulated timing data for the base event is a sum of the timing data of prior base events and a current base event, and the accumulated timing data for the companion event is a sum of the accumulated timing data for the base event and the vernier data of the companion event defined with reference to the base event, and wherein the accumulated timing data for each group of the base event and the companion event is produced in the parallel form by the event summing logic.

5. An event processing apparatus as defined in claim 1, wherein the accumulated timing data is a sum of the timing data of prior base and companion events and a current event which is produced by serial processing by the event summing logic, and wherein the accumulated timing data for each group of the base event and the companion event is produced in the parallel form by the event summing logic.

6. An event processing apparatus as defined in claim 4, wherein a number of the parallel outputs of the event summing logic corresponds to a ratio of the frequencies between the processing clock and the event clock.

7. An event processing apparatus as defined in claim 6, wherein the number of the parallel outputs of the event summing logic corresponds to a total number of the base event and the companion events in each group of the event data stored in the event memory.

8. An event processing apparatus as defined in claim 5, wherein a number of the parallel outputs of the event summing logic corresponds to a ratio of the frequencies between the processing clock and the event clock.

9. An event processing apparatus as defined in claim 8, wherein the number of the parallel outputs of the event summing logic corresponds to a total number of the base event and the companion events in each group of the event data stored in the event memory.

10. An event processing apparatus as defined in claim 1, wherein the event summing logic is comprised of:
an event count logic for counting a number of a processing clock and producing a terminal count pulse when the counted number reaches a value specified by the event count data of the base event;
an event processing state machine for producing an enable signal upon receiving the terminal count pulse from the event count logic;
an accumulator for accumulating the event vernier data of the base events and producing the accumulated vernier data upon receiving the enable signal from the event processing state machine; and
at least one adder for adding the vernier data of the companion event to the accumulated vernier data from the accumulator;
wherein the data from the accumulator and the data from the adder are output in the parallel form.

11. An event processing apparatus as defined in claim 1, wherein the event summing logic is comprised of:
an event count logic for counting a number of a processing clock and producing a terminal count pulse when the counted number reaches a value specified by the event count data of the base event;
an event processing state machine for producing an enable signal upon receiving the terminal count pulse from the event count logic;
an accumulator for accumulating the event vernier data of the base events and the event vernier data of the companion events and producing the accumulated vernier data upon receiving the enable signal from the event processing state machine; and
at least one adder for adding the vernier data of the companion event to the accumulated vernier data from the accumulator;
wherein the data from the accumulator and the data from the adder are output in the parallel form.

12. An event processing apparatus for use with an event based test system for testing a semiconductor device under test (DUT), comprising:
an event memory for storing event data of each event where the event data includes timing data for each event which is formed with event count data which is an integer multiple of a clock period and event vernier data which is a fraction of the clock period, wherein the event data are specified as groups of events where each group of event is configured by one base event and at least one companion event;
an event summing logic for accumulating the timing data and producing the accumulated timing data of an event at N outputs in a parallel form, wherein the event summing logic is operated by a processing clock; and
an event generator for generating events specified by the event data based on N accumulated timing data received in the parallel form from the event summing logic;
wherein the event generator receives N accumulated timing data in the parallel form from the event summing logic at a rate of the processing clock and produces the accumulated timing data in a serial form at a rate of an event clock which is N times higher than that of the processing clock.

13. An event processing apparatus as defined in claim 12, wherein the event data stored in the event memory includes event type data for each event to specify a type of event to be produced by the event generator.

14. An event processing apparatus as defined in claim 13, wherein the event type data includes a no-operation (NOP) event inserted in a series of events thereby producing the delay time by the event generator without involving a change in a logic state of the event.

15. An event processing apparatus as defined in claim 12, wherein the event generator data is comprised of:
an event demultiplex logic for receiving the accumulated timing data in the parallel form from the event summing logic at the rate of the processing clock and producing the accumulated timing data in the serial form at the rate of the event clock; and
an event delay logic for adding a delay time specified by the accumulated vernier data to a timing of the corresponding accumulated vernier data in the serial form;
wherein the delay time has a timing resolution proportional to a number of data bits used for the accumulated vernier data and to a frequency of the event clock.

16. An event processing apparatus as defined in claim 12, wherein the timing data for the base event is formed of a set of the event count data and the event vernier data while the timing data for the companion event is formed solely of the event vernier data.

17. An event processing apparatus as defined in claim 12, wherein the accumulated timing data for the base event is a sum of the timing data of prior base events and a current base event, and the accumulated timing data for the companion event is a sum of the accumulated timing data for the base event and the vernier data of the companion event defined with reference to the base event, and wherein the accumulated timing data for each group of the base event and the companion event is produced in the parallel form by the event summing logic.

18. An event processing apparatus as defined in claim 12, wherein the accumulated timing data is a sum of the timing data of prior base and companion events and a current event which is produced by serial processing by the event summing logic, and wherein the accumulated timing data for each group of the base event and the companion event is produced in the parallel form by the event summing logic.

19. An event processing apparatus as defined in claim 12, wherein the event summing logic is comprised of:
an event count logic for counting a number of the processing clock and producing a terminal count pulse when the counted number reaches a value specified by the event count data of the base event;
an event processing state machine for producing an enable signal upon receiving the terminal count pulse from the event count logic;
an accumulator for accumulating the event vernier data of the base events and producing the accumulated vernier data upon receiving the enable signal from the event processing state machine; and at least one adder for adding the vernier data of the companion event to the accumulated vernier data from the accumulator;

wherein the data from the accumulator and the data from the adder are output in the parallel form.

20. An event processing apparatus as defined in claim 19, wherein the accumulator in the event summing logic accumulates the event vernier data of both the base events and the companion events and producing the accumulated vernier data upon receiving the enable signal from the event processing state machine.

21. An event processing method for use with an event based test system, comprising the following steps of:

storing event data which includes timing data for each event and is formed with event count data which is an integer multiple of a clock period and event vernier data which is a fraction of the clock period where the event data are specified as groups of events where each group of event is configured by one base event and at least one companion event;

accumulating the timing data and producing the accumulated timing data of an event for the base event and the companion event in a parallel form; and generating the events specified by the event data based on the accumulated timing data received in the parallel forms wherein the clock period is a one cycle time length of a processing clock which is a reference clock for operating hardware of the event processing apparatus, and wherein the event summing logic produces the accumulated timing data at a plurality of outputs in the parallel form thereby enabling to produce the events at a rate of an event clock which has a frequency higher than the processing clock.

22. An event processing method as defined in claim 21, wherein the step of storing the event data in the event memory includes a step of storing event type data for each event to specify a type of event to be generated.

23. An event processing method as defined in claim 21, wherein the step of accumulating the timing data includes a step of producing accumulated timing data for the base event which is a sum of the timing data of prior base events and a current base event, and a step of producing accumulated timing data for the companion event which is a sum of the accumulated timing data for the base event and the vernier data of the companion event defined with reference to the base event.

24. An event processing method as defined in claim 21, wherein the step of accumulating the timing data includes a step of producing accumulated timing data which is a sum of the timing data of prior base and companion events and a current event through serial processing.

25. An event processing method for use with an event based test system for testing a semiconductor device under test (DUT), comprising the following steps of:

storing event data which includes timing data for each event and is formed with event count data which is an integer multiple of a clock period and event vernier data which is a fraction of the clock period, wherein the event data are specified as groups of events where each group of event is configured by one base event and at least one companion event;

accumulating the timing data and producing the accumulated timing data of an event at N outputs in a parallel form at a rate of a processing clock; and receiving N accumulated timing data in the parallel form at the rate of the processing clock and producing the accumulated timing data in a serial form at a rate of an event clock which is N times higher than that of the processing clock.

26. An event processing method as defined in claim 25, further comprising a step of adding a delay time specified by the accumulated vernier data to a timing of the corresponding accumulated vernier data in the serial form, wherein the delay time has a timing resolution proportional to a number of data bits used for the accumulated vernier data and to a frequency of the event clock.

27. An event processing method as defined in claim 25, wherein the step of storing the event data in the event memory includes a step of storing event type data for each event to specify a type of event to be generated, and wherein the event type data includes a no-operation (NOP) event for inserting a delay time in a sequence of events without changing a logic state of the event.

28. An event processing method as defined in claim 25, wherein the step of accumulating the timing data includes a step of producing accumulated timing data for the base event which is a sum of the timing data of prior base events and a current base event, and a step of producing accumulated timing data for the companion event which is a sum of the accumulated timing data for the base event and the vernier data of the companion event defined with reference to the base event.

29. An event processing method as defined in claim 25, wherein the step of accumulating the timing data includes a step of producing accumulated timing data which is a sum of the timing data of prior base and companion events and a current event through serial processing.

* * * * *